(12) United States Patent
Kim

(10) Patent No.: US 11,258,276 B2
(45) Date of Patent: Feb. 22, 2022

(54) POWER SUPPLY CONTROL METHOD AND APPARATUS OF BATTERY MANAGEMENT SYSTEM

(71) Applicant: Samsung Electronics Co., Ltd., Suwon-si (KR)

(72) Inventor: Youngjae Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 216 days.

(21) Appl. No.: 16/677,888

(22) Filed: Nov. 8, 2019

(65) Prior Publication Data

US 2021/0013723 A1    Jan. 14, 2021

(30) Foreign Application Priority Data

Jul. 12, 2019    (KR) .................. 10-2019-0084633

(51) Int. Cl.
| | |
|---|---|
| *H02J 7/00* | (2006.01) |
| *H01M 10/44* | (2006.01) |
| *H01M 10/42* | (2006.01) |
| *G01N 21/01* | (2006.01) |
| *G01R 31/382* | (2019.01) |
| *H03J 1/00* | (2006.01) |
| *H01M 50/20* | (2021.01) |

(52) U.S. Cl.
CPC ............ *H02J 7/0021* (2013.01); *G01N 21/01* (2013.01); *G01R 31/382* (2019.01); *H01M 10/425* (2013.01); *H01M 10/4207* (2013.01); *H01M 10/441* (2013.01); *H01M 50/20* (2021.01); *H03J 1/0025* (2013.01); *H01M 2010/4271* (2013.01); *H01M 2220/20* (2013.01)

(58) Field of Classification Search
USPC ........................................... 320/134
See application file for complete search history.

(56) References Cited

U.S. PATENT DOCUMENTS

| | | | |
|---|---|---|---|
| 4,426,662 | A | 1/1984 | Skerlos et al. |
| 7,840,142 | B2 | 11/2010 | Keller |
| 7,879,485 | B2 | 2/2011 | Yoon et al. |
| 8,117,857 | B2 | 2/2012 | Kelty et al. |
| 8,508,191 | B2 | 8/2013 | Kim et al. |

(Continued)

FOREIGN PATENT DOCUMENTS

| | | |
|---|---|---|
| JP | 2011-134300 A | 7/2011 |
| JP | 4735709 B2 | 7/2011 |

(Continued)

OTHER PUBLICATIONS

Dietz, Paul et al., "Very Low-Cost Sensing and Communication Using Bidirectional LEDs", *International Conference on Ubiquitous Computing*, Springer, Berlin, Heidelberg, Jul. 2003 (19 pages in English).

*Primary Examiner* — Mohammed Alam
(74) *Attorney, Agent, or Firm* — NSIP Law

(57) ABSTRACT

Disclosed is a battery management system (BMS) power supply management apparatus and method. The BMS power supply management apparatus includes an optoelectronic element configured to generate a current in response to an optical signal, a conversion element configured to convert the current into a wake-up voltage, and a first switch configured to switch a wake-up signal for a BMS, in response to the wake-up voltage.

18 Claims, 23 Drawing Sheets

(56) References Cited

U.S. PATENT DOCUMENTS

| | | | |
|---|---|---|---|
| 8,618,775 | B2 | 12/2013 | Hermann et al. |
| 8,624,560 | B2 | 1/2014 | Ungar et al. |
| 8,961,203 | B2 | 2/2015 | Lee |
| 8,972,213 | B2 | 3/2015 | Zhang et al. |
| 9,290,137 | B2 | 3/2016 | Ooya |
| 2016/0277879 | A1* | 9/2016 | Daoura .................. H04W 4/80 |
| 2018/0012484 | A1 | 1/2018 | Sakabe et al. |
| 2018/0139698 | A1 | 5/2018 | Quinlan et al. |
| 2019/0154439 | A1* | 5/2019 | Binder .................... G01S 15/08 |
| 2019/0182415 | A1* | 6/2019 | Sivan ...................... G06F 1/163 |
| 2020/0189731 | A1* | 6/2020 | Mistry .................. B64C 39/022 |
| 2021/0013723 | A1* | 1/2021 | Kim .................. H01M 10/4207 |
| 2021/0119549 | A1* | 4/2021 | Wang .................... H01M 10/42 |

FOREIGN PATENT DOCUMENTS

| | | |
|---|---|---|
| JP | 5988202 B2 | 9/2016 |
| KR | 2000-0055227 A | 9/2000 |
| KR | 2001-0021687 A | 3/2001 |
| KR | 10-2004-0053711 A | 6/2004 |
| KR | 10-2006-0108149 A | 10/2006 |
| KR | 10-2008-0013242 A | 2/2008 |
| KR | 10-0814020 B1 | 3/2008 |
| KR | 10-2013-0046418 A | 5/2013 |
| KR | 10-2013-0090122 A | 8/2013 |
| KR | 10-1606085 B1 | 3/2016 |
| KR | 10-1623887 B1 | 5/2016 |
| KR | 10-1718552 B1 | 3/2017 |
| KR | 10-2017-0128750 A | 11/2017 |
| KR | 10-1832783 B1 | 2/2018 |
| KR | 10-2019-0011567 A | 2/2019 |

* cited by examiner

POWER SUPPLY CONTROL METHOD AND APPARATUS OF BATTERY MANAGEMENT SYSTEM

CROSS-REFERENCE TO RELATED APPLICATIONS

This application claims the benefit under 35 USC § 119(a) of Korean Patent Application No. 10-2019-0084633 filed on Jul. 12, 2019 in the Korean Intellectual Property Office, the entire disclosure of which is incorporated herein by reference for all purposes.

BACKGROUND

1. Field

The following description relates to method for controlling a power supply of a battery pack and a battery management system (BMS).

2. Description of Related Art

A battery management system (BMS) manages a battery, for example, maintains an optimal state by monitoring a voltage, a current, and a temperature of a battery pack, predicts a battery replacement time, and detects a problem that may occur in the battery, in advance. The BMS also secures the battery performance through fault diagnosis by monitoring, controlling, and managing battery states.

Electronic devices do not completely cut off power to receive an external signal and an instruction from outside, in a standby mode. Thus, a power loss occurs in the standby mode. The BMS also requires some standby power to receive an instruction from outside in a standby mode, which causes a power loss.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery management system (BMS) power supply management apparatus, including an optoelectronic element configured to generate a current in response to an optical signal, a conversion element configured to convert the current into a wake-up voltage, and a first switch configured to switch a wake-up signal for a BMS, in response to the wake-up voltage.

The BMS power supply management apparatus may include a second switch configured to switch a current flowing through the first switch.

The BMS power supply management apparatus may include a first resistor connected the optoelectronic element and a battery.

The BMS power supply management apparatus may include a second resistor connected to the conversion element and a battery such that the wake-up voltage is applied thereto.

The BMS power supply management apparatus may include a controller that may be configured to control the first switch based on the wake-up signal.

The controller may be configured to supply power to the BMS by shorting the first switch based on the wake-up signal.

The BMS power supply management apparatus may include a first control switch that may be configured to control the first switch, in response to a control of the controller.

The BMS power supply management apparatus may include a second control switch that may be configured to control the second switch, in response to a control of the controller.

The optoelectronic element may be configured to output an optical signal to another BMS adjacent to the BMS, in response to another control of the controller.

The optoelectronic element may include an infrared light emitting diode (IR LED).

In another general aspect, there is provided a battery management system (BMS) power supply management method, including generating a current in response to an optical signal, converting the current into a wake-up voltage, and first switching a wake-up signal to be provided to a BMS, in response to the wake-up voltage.

The BMS power supply management method may include second switching the first switched wake-up signal.

The converting may include converting the current into the wake-up voltage through a first resistor connected to an optoelectronic element configured to generate the current and a battery.

The first switching may include applying the wake-up voltage to a second resistor connected to a conversion element configured to convert the current into the wake-up voltage and a battery, wherein the first switching of the wake-up signal comprises first switching the wake-up signal based on the wake-up voltage applied to the second resistor.

The BMS power supply management method may include controlling a first switch to provide power to the BMS based on the wake-up signal.

The controlling may include supplying the power to the BMS by shorting the first switch based on the wake-up signal.

The controlling may include generating a first control signal to control the first switch, and controlling the first switch based on the first control signal.

The second switching may include generating a second control signal to control a second switch to perform the second switching, and controlling the second switch based on the second control signal.

The BMS power supply management method may include outputting an optical signal to another BMS adjacent to the BMS.

The generating may include generating the current from an infrared ray received through an infrared light emitting diode (IR LED).

Other features and aspects will be apparent from the following detailed description, the drawings, and the claims.

Figure 1:
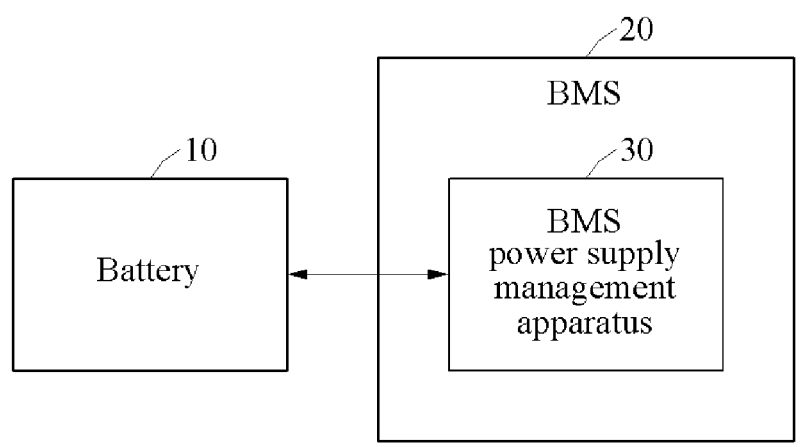
FIG. 1 illustrates an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

It will be understood that when a component is referred to as being "connected to" another component, the component can be directly connected or coupled to the other component or intervening components may be present.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

FIG. 1 illustrates an example of a battery system.

Referring to FIG. 1, a battery converts chemical energy into electricity, stores the electricity, and generates a current to supply power to an electric device that is connected to the battery. In an example, the battery is implemented in the form of a battery pack.

The battery pack includes one or more battery modules, and a battery module includes one or more battery cells. Hereinafter, the battery is interpreted as including a battery pack, a battery module, and a battery cell.

A battery system includes a battery 10 and a battery management system (BMS) 20. The battery system supplies power to an electronic device. The battery system efficiently manages electric energy through the battery 10 and the BMS 20.

The BMS 20 manages a battery to maintain an optimal state of the battery by monitoring a voltage, a current, and a temperature of the battery. Through this, it is possible to predict a life of the battery, and guarantee the performance of the battery by detecting a problem of the battery in advance.

The BMS 20 uses a power supply. The BMS 20 includes a BMS power supply management apparatus 30.

When the battery includes a plurality of battery cells, the plurality of battery cells may each include a separate BMS 20. In this example, each BMS 20 includes a BMS power supply management apparatus 30.

The BMS power supply management apparatus 30 manages the power supply of the BMS 20. The BMS power supply management apparatus 30 increases the power efficiency by minimizing a power consumption of the BMS 20, and increases the energy efficiency of the battery 10.

The BMS power supply management apparatus 30 eliminates standby power of the BMS 20. The BMS power supply management apparatus 30 minimizes the power consumption by eliminating the standby power of the BMS 20 applied to each battery cell.

The BMS power supply management apparatus 30 manages the power supply of the BMS 20 by exchanging information between the battery cells using optical signals.

The BMS power supply management apparatus 30 is implemented in various devices, such as, for example, a vehicle, a walking assistance device, a wearable device, a security device, a robot, a mobile terminal, a hybrid vehicle, or an energy storage system (ESS), various Internet of Things (IoT) devices, a smart appliance, a smart home device, a security device for gate control, a machine-type communication device, or a portable electronic device. The vehicle described herein refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an autonomous or automated driving vehicle, an automatic or autonomous driving system, an intelligent vehicle, an advanced driver assistance system (ADAS), a self-driving vehicle, an unmanned aerial vehicle, an electric vehicle (EV), a hybrid vehicle, or a drone.

The portable electronic device refers to various electronic devices, such as, for example, a mobile telephone, a smartphone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a computing device, for example, a server, a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), an ultra mobile personal computer (UMPC), a portable lab-top PC, electronic product, for example, a robot, a digital camera, a digital video camera, a portable game console, an MP3 player, a portable/personal multimedia player (PMP), a handheld e-book, a global positioning system (GPS) navigation, a personal navigation device, portable navigation device (PND), a head-up display (HUD), a handheld game console, an e-book, a television (TV), a high definition television (HDTV), or a smart TV.

Figure 2:
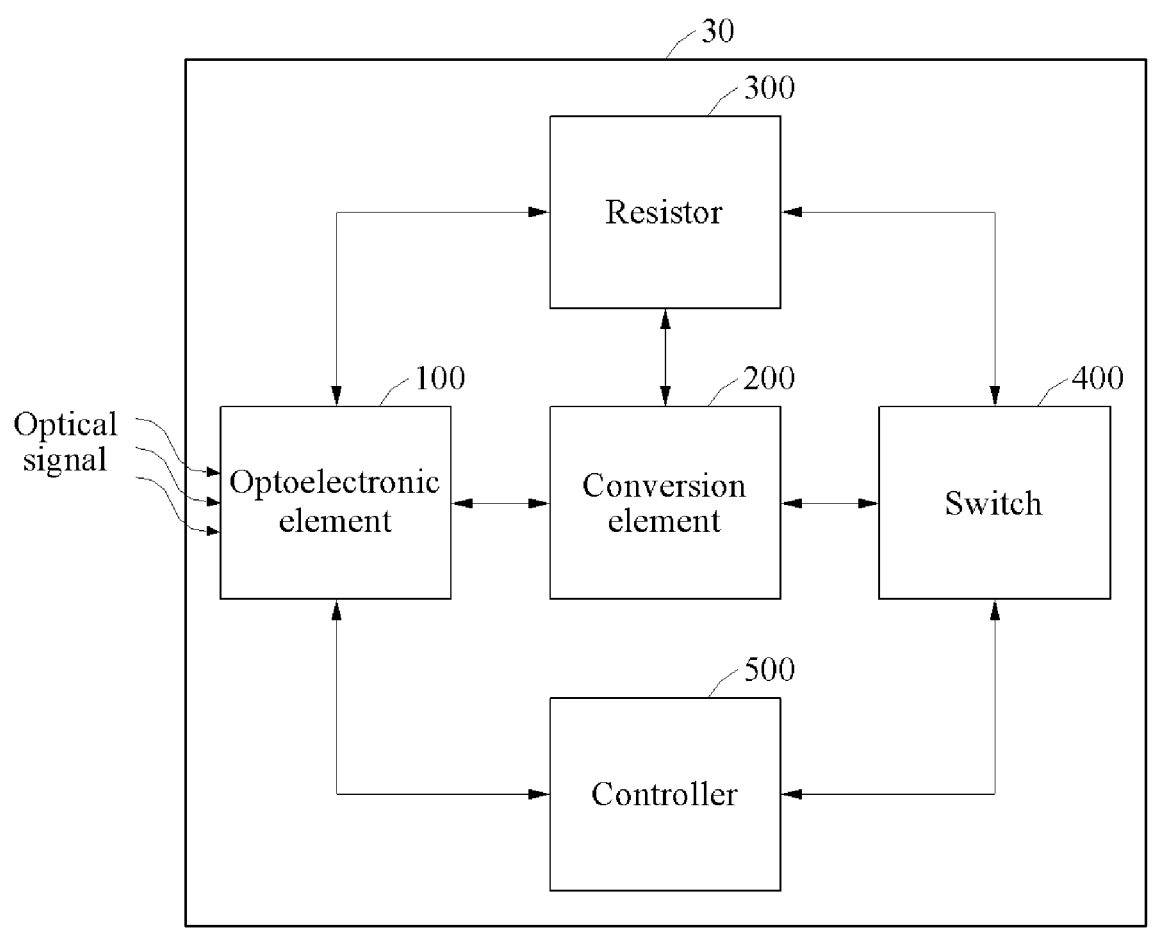
FIG. 2 illustrates an example of a battery management system (BMS) power supply management apparatus shown in FIG. 1.
Figure 3:
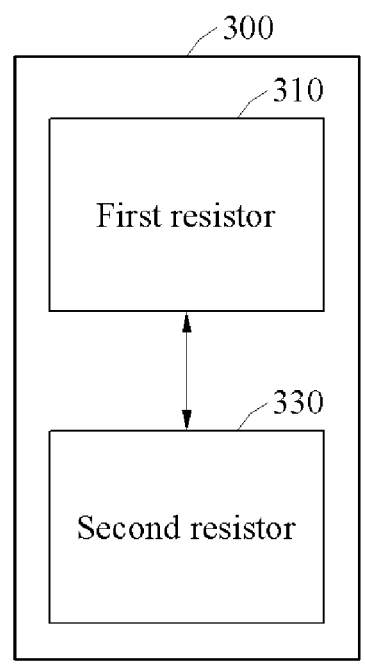
FIG. 3 illustrates an example of a resistor shown in FIG. 2.
Figure 4:
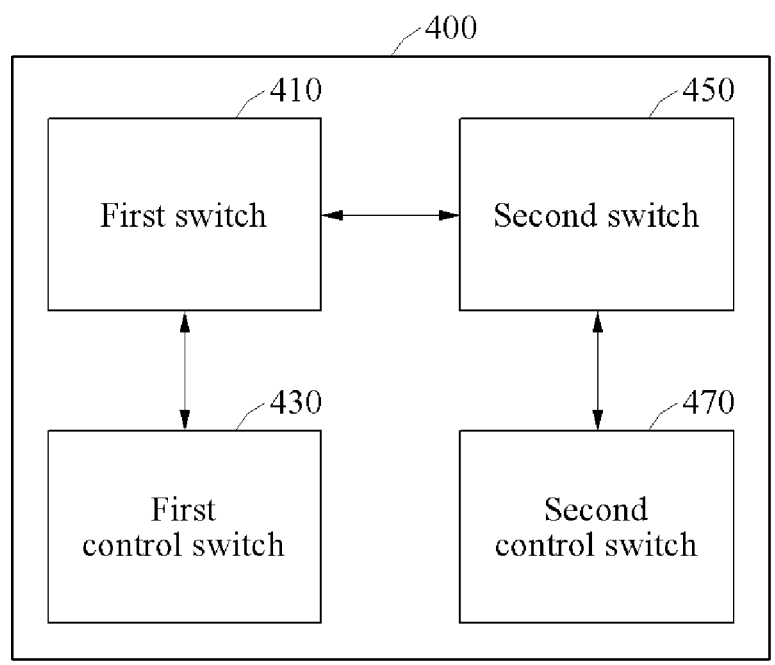
FIG. 4 illustrates an example of a switch shown in FIG. 2.

FIG. 2 illustrates an example of a BMS power supply management apparatus shown in FIG. 1, FIG. 3 illustrates an example of a resistor shown in FIG. 2, and FIG. 4 illustrates an example of a switch shown in FIG. 2.

Referring to FIGS. 2 through 4, the BMS power supply management apparatus 30 includes an optoelectronic element 100, a switch 400, and a controller 500. The BMS power supply management apparatus 30 further includes a conversion element 200 and a resistor 300.

The optoelectronic element 100 generates a current by receiving an optical signal. That is, the optoelectronic element 100 converts the optical signal into an electrical signal.

The optical signal includes an electromagnetic wave of a band. For example, the optical signal includes a visible light signal, an infrared signal, an ultraviolet signal, and an X-ray signal.

The optoelectronic element 100 outputs an output signal to another BMS (not shown) adjacent to the BMS 20 in response to a control of the controller 500. Further, the optoelectronic element 100 outputs the generated current to the conversion element 200.

In an example, the optoelectronic element 100 includes a photodiode. The photodiode includes a PIN photodiode, an avalanche photodiode (APD), a single-photon avalanche diode (SPAD), and a phototransistor. For example, the optoelectronic element 100 includes an infrared light emitting diode (IR LED).

The conversion element 200 converts the current into a wake-up voltage. The conversion element 200 converts the current received from the optoelectronic element 100 into the wake-up voltage. The conversion element 200 is implemented as an amplifier. The amplifier includes a bipolar junction transistor (BJT).

A first resistor 310 is connected to one end of the optoelectronic element 100 and one end of the battery 10. The first resistor 310 applies a voltage to the conversion element 200 by causing a voltage drop based on the current generated by the optoelectronic element 100.

The current generated by the optoelectronic element 100 is converted into the wake-up voltage through the first resistor 310 connected to one end of the optoelectronic element 100 and one end of the battery 10.

The wake-up voltage refers to a drive voltage to drive the switch 400. For example, the wake-up voltage includes a drive voltage to drive a first switch 410. The wake-up voltage will be described further with reference to FIG. 5A.

When the current generated by the optoelectronic element 100 flows through the first resistor 310, a voltage drop occurs with respect to a voltage supplied by the battery 10, and thus the conversion element 200 is driven.

A second resistor 330 is connected to one end of the conversion element 200 and one end of the battery 10. The wake-up voltage generated by the conversion element 200 is applied to the second resistor 330.

The switch 400 switches a wake-up signal to be provided to the BMS 20 when the wake-up voltage is generated by the conversion element 200.

The wake-up signal includes the current flowing from the battery 10 to the BMS 20 or the voltage provided by the battery 10. The wake-up signal wakes up the controller 500 such that the controller 500 turns on the BMS 20.

In an example, the switch 400 is implemented as a transistor. For example, the transistor includes a field effect transistor (FET).

The switch 400 includes switches to switch the wake-up signal, and control switches to control the switches. For example, the switch 400 includes the first switch 410, a first control switch 430, a second switch 450, and a second control switch 470.

The first switch 410 switches the wake-up signal to be provided to the BMS 20 in response to the wake-up voltage. The second switch 450 switches the current flowing through the first switch 410. That is, the second switch 450 second switches the first switched wake-up signal.

The first control switch 430 controls the first switch 410. The first control switch 430 controls the first switch 410 in response to a control of the controller 500. For example, the first control switch 430 shorts or opens the first switch 410 in response to the control of the controller 500.

The second control switch 470 controls the second switch 450. The second control switch 470 controls the second switch 450 in response to a control of the controller 500. For example, the second control switch 470 shorts or opens the second switch 450 in response to the control of the controller 500.

The controller 500 includes a processor (not shown). The controller 500 controls the BMS power supply management apparatus 30 through the processor.

The processor processes data stored in a memory (not shown). The processor executes computer-readable codes, for example, software, stored in the memory and instructions triggered by the processor.

The "processor" is a data processing device implemented by hardware including a circuit having a physical structure to perform desired operations. For example, the desired operations include instructions or codes included in a program.

For example, the hardware-implemented data processing device includes a microprocessor, a central processing unit (CPU), a processor core, a multi-core processor, a multiprocessor, an application-specific integrated circuit (ASIC), and a field programmable gate array (FPGA).

The controller 500 controls the switch 400 based on the wake-up signal. The controller 500 controls the first switch 410 and/or the second switch 450 based on the wake-up signal.

In detail, the controller 500 controls the first switch 410 and/or the second switch 450 by controlling the first control switch 430 and/or the second control switch 470.

The controller 500 generates a first control signal to control the first control switch 430, and the first control switch 430 controls the first switch 410 based on the first control signal.

The controller 500 generates a second control signal to control the second control switch 470, and the second control switch 470 controls the second switch 450 based on the second control signal.

In an example, the controller 500 supplies power to the BMS 20 by shorting the first switch 410 and/or the second switch 450 based on the wake-up signal.

In an example, the controller 500 controls the optoelectronic element 100 to output optical signals to other BMSes (not shown) adjacent to the BMS 20. An operation of outputting optical signals to adjacent BMSes will be further described in detail with reference to FIG. 11.

Figure 5A:
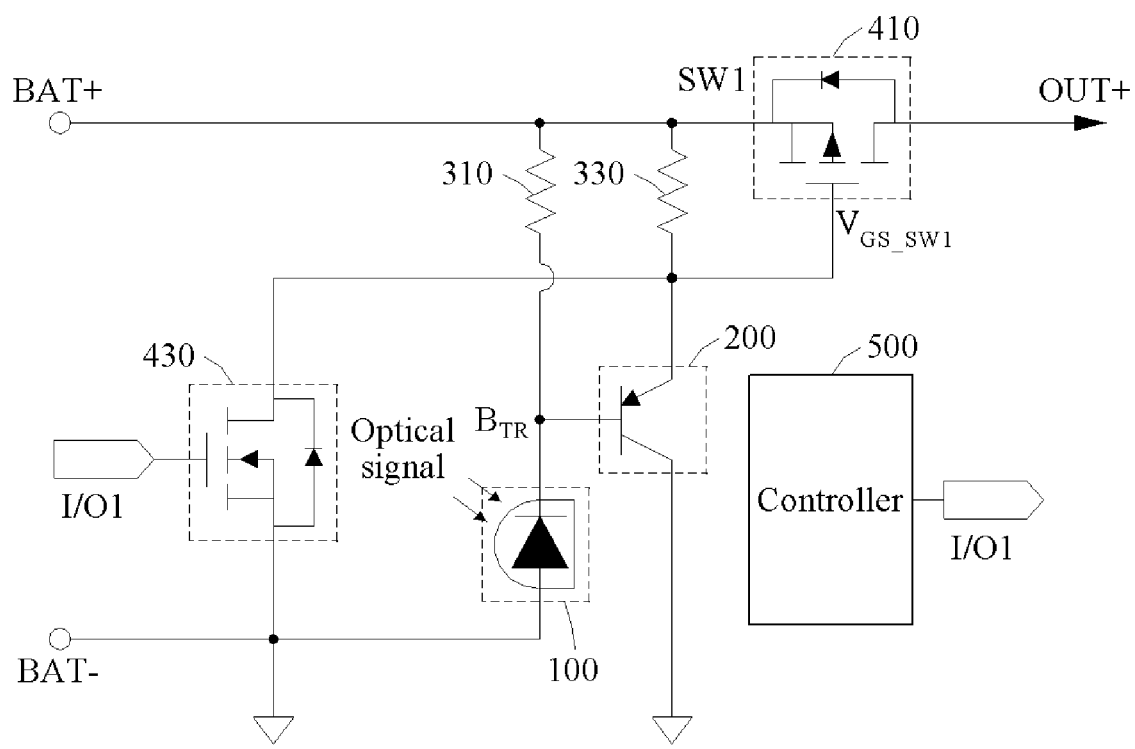
FIG. 5A illustrates an example of a circuit diagram of the BMS power supply management apparatus of FIG. 2.

FIG. 5A illustrates an example of a circuit diagram of the BMS power supply management apparatus of FIG. 2.

Referring to FIG. 5A, the optoelectronic element 100 receives an optical signal. For example, the optoelectronic element 100 is implemented as an IR LED and receives an infrared ray.

The optoelectronic element 100 generates a current from the received optical signal. The generated current flows through the first resistor 310 and/or the conversion element 200 and is converted through the conversion element 200.

One end of the optoelectronic element 100 is connected to the conversion element 200 and the first resistor 310, and the other end thereof is connected to a ground and a negative electrode of the battery 10. The optoelectronic element 100 is connected reversely depending on a configuration of a circuit.

The conversion element 200 generates a wake-up voltage based on the current generated by the optoelectronic element 100. In an example, the conversion element 200 is implemented as a BJT. In the example of FIG. 5A, the BJT is indicated as a PNP BJT. In other examples, the BJT may be implemented as a PNP or NPN BJT depending on the configuration of the circuit.

When the conversion element 200 is implemented as a BJT, the current flows between an emitter and a collector of the BJT based on a voltage drop occurring at a base of the BJT due to the current generated by the optoelectronic element 100.

The current flowing between the emitter and the collector causes a voltage drop at both ends of the second resistor 330, and the voltage drop acts as the wake-up voltage.

One end of the conversion element 200 is connected to the first resistor 310 and the optoelectronic element 100, and another end of the conversion element 200 is connected to a ground. The other end of the conversion element 200 is connected to the second resistor 330 and the first switch 410.

For example, when the conversion element 200 is a BJT, a base of the BJT is connected to the optoelectronic element 100 and the first resistor 310, an emitter thereof is connected to the second resistor 330 and the first switch 410, and a collector thereof is connected to the ground.

The wake-up voltage is applied to the first switch 410 and shorts the first switch 410, thereby providing a wake-up signal to the controller 500 of the BMS 20. The wake-up signal is supplied from the battery 10 to the first switch 410.

The first switch 410 and the first control switch 430 are each implemented as an FET. In an example, the FET is implemented as a P-channel or N-channel metal oxide semiconductor field-effect transistor (MOSFET). The first switch 410 and the first control switch 430 each include a body diode.

For example, the first switch 410 is implemented as a P-channel FET, and the first control switch 430 is implemented as an N-channel FET. In another example, the reverse is also possible.

One end of the first switch 410 is connected to both ends of the battery 10, another end thereof is connected to the BMS 20 and/or the controller 500, and the other end thereof is connected to the second resistor 330, the conversion element 200, and the first control switch 430.

For example, when the first switch 410 is implemented as an FET, a gate of the FET is connected to the conversion element 200, the second resistor 330, and the first control switch 430. A source of the FET is connected to both ends of the battery 10, and a drain of the FET is connected to the BMS 20 and/or the controller 500.

The controller 500 controls the first switch 410 based on the wake-up signal. The controller 500 generates a first control signal when receiving the wake-up signal. The controller 500 transmits the first control signal to the first control switch 430. In the example of FIG. 5A, the first control signal is indicated as I/O1.

The first control switch 430 controls the first switch 410 based on the first control signal. In detail, the controller 500 turns on the first switch 410 by shorting the first control switch 430 using the first control signal. The turned on first switch 410 stably provides power to the BMS 20.

One end of the first control switch 430 is connected to the controller 500, another end thereof is connected to the second resistor 330 and the first switch 410, and the other end thereof is connected to the ground, the negative electrode of the battery 10, and the optoelectronic element 100.

For example, when the first control switch 430 is an FET, a gate is connected to the controller 500, a drain is connected to the second resistor 330 and the first switch 410, and a source is connected to the ground, the negative electrode of the battery 10, and the optoelectronic element 100.

Power supplied in response to a control of the controller 500 is a signal with a higher magnitude than the wake-up signal.

Figure 5B:
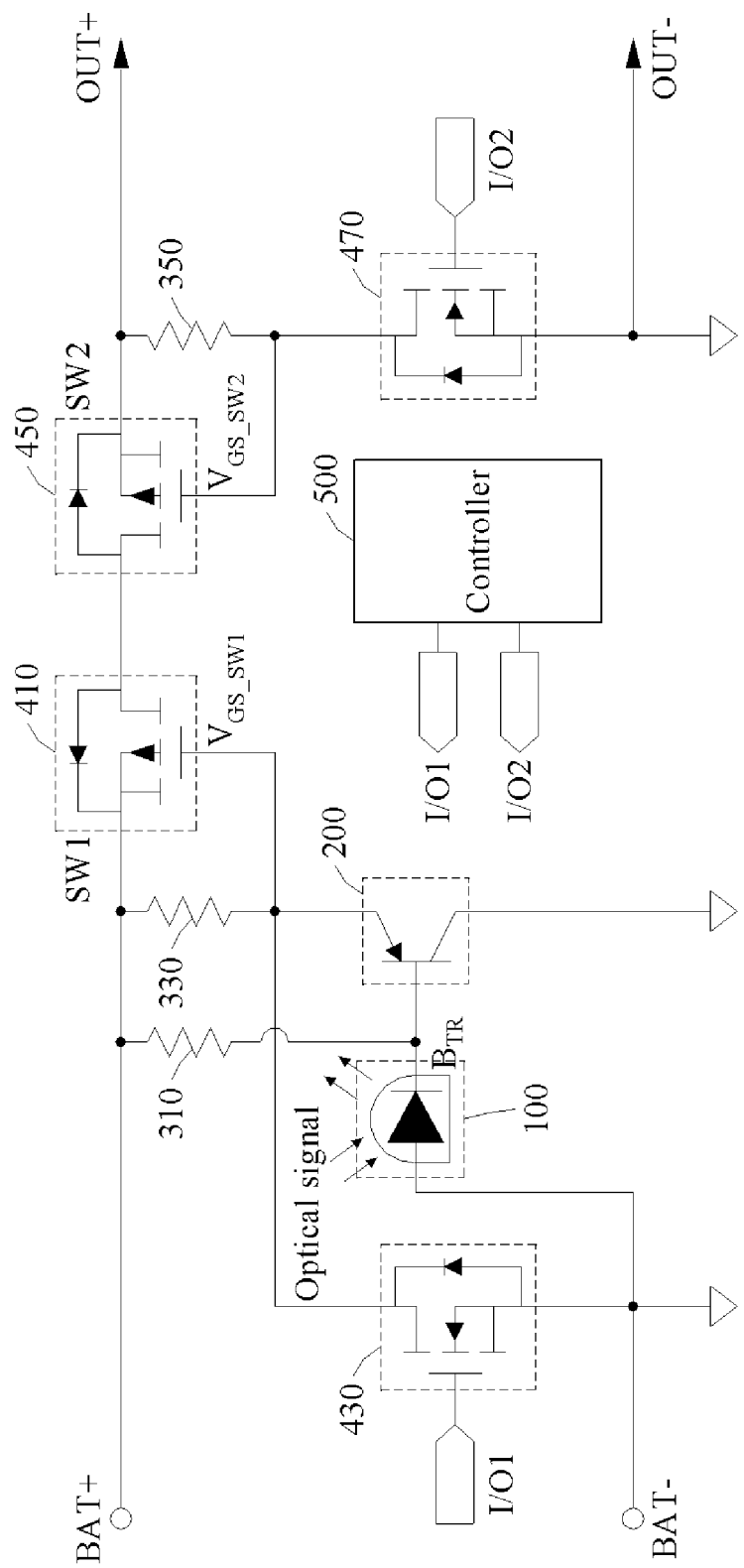
FIG. 5B illustrates an example of a circuit diagram of the BMS power supply management apparatus of FIG. 2.

FIG. 5B illustrates an example of a circuit diagram of the BMS power supply management apparatus of FIG. 2.

Referring to FIG. 5B, an example in which the second switch 450 and the second control switch 470 are added to the circuit diagram of FIG. 5A is illustrated. The components except for the second switch 450 and the second control switch 470 operate in the same manner as described in FIG. 5A. In addition to the description of FIG. 5B below, the descriptions of FIGS. 1-5A are also applicable to FIG. 5B and are incorporated herein by reference. Thus, the above description may not be repeated here.

The second switch 450 is connected to the first switch 410 in series. In an example, the second switch 450 and the second control switch 470 are each implemented as an FET. The FET is implemented as a P-channel or N-channel MOSFET. The second switch 450 and the second control switch 470 each include a body diode.

For example, the second switch 450 is implemented as a P-channel FET, and the second control switch 470 is implemented as an N-channel FET. In another example, the reverse is also possible.

One end of the second switch 450 is connected to the second control switch 470 and a third resistor 350, another end of the second switch 450 is connected to the first switch 410, and the other end of the second switch 450 is connected to the BMS 20 and/or the controller 500, and the third resistor 350.

For example, when the second switch 450 is an FET, a gate of the FET is connected to the third resistor 350 and the second control switch 470. A drain of the FET is connected to the first switch 410, and a source of the FET is connected to the third resistor 350, and the BMS 20 and/or the controller 500.

In an example, the second switch 450 is connected to the first switch 410 in series, and switches a current flowing through the first switch 410. A wake-up signal is transmitted through the first switch 410 and then, through the second switch 450 and provided to the controller 500 of the BMS 20.

When the first switch 410 is shorted, the wake-up signal is transmitted through the first switch 410 and flows through the body diode of the second switch 450 to the BMS 20 and/or the controller 500.

That is, even when the second switch 450 is turned off, the wake-up signal flows through the body diode, and thus, is supplied to the controller 500 of the BMS 20.

The controller 500 generates a first control signal and/or a second control signal in response to the wake-up signal. Operations of the first control switch 430 and the first switch 410 by the first control signal are the same as the description provided with reference to FIG. 5A.

The controller 500 generates the second control signal. The controller 500 transmits the second control signal to the second control switch 470. In the example of FIG. FIG. 5B, the second control signal is indicated as I/O2.

The second control switch 470 controls the second switch 450 based on the first control signal. In detail, the controller 500 turns on the second switch 450 by shorting the second control switch 470 using the first control signal. The turned on second switch 450 stably provides power to the BMS 20.

One end of the second control switch 470 is connected to the controller 500, another end thereof is connected to the third resistor 350 and the second switch 450, and the other end thereof is connected to a ground, and the BMS 20 and/or the controller 500.

For example, when the second control switch 470 is an FET, a gate is connected to the controller 500, a drain is connected to the third resistor 350 and the second switch 450, and a source is connected to the ground, and the BMS 20 and/or the controller 500.

The second switch 450 prevents a flow of a countercurrent in the BMS 20 when electrodes of the battery 10 are connected reversely. That is, the body diode of the second switch 450 has a direction different from that of the body diode of the first switch 410, thereby blocking a current flowing from the second switch 450 to the first switch 410.

Figure 6A:
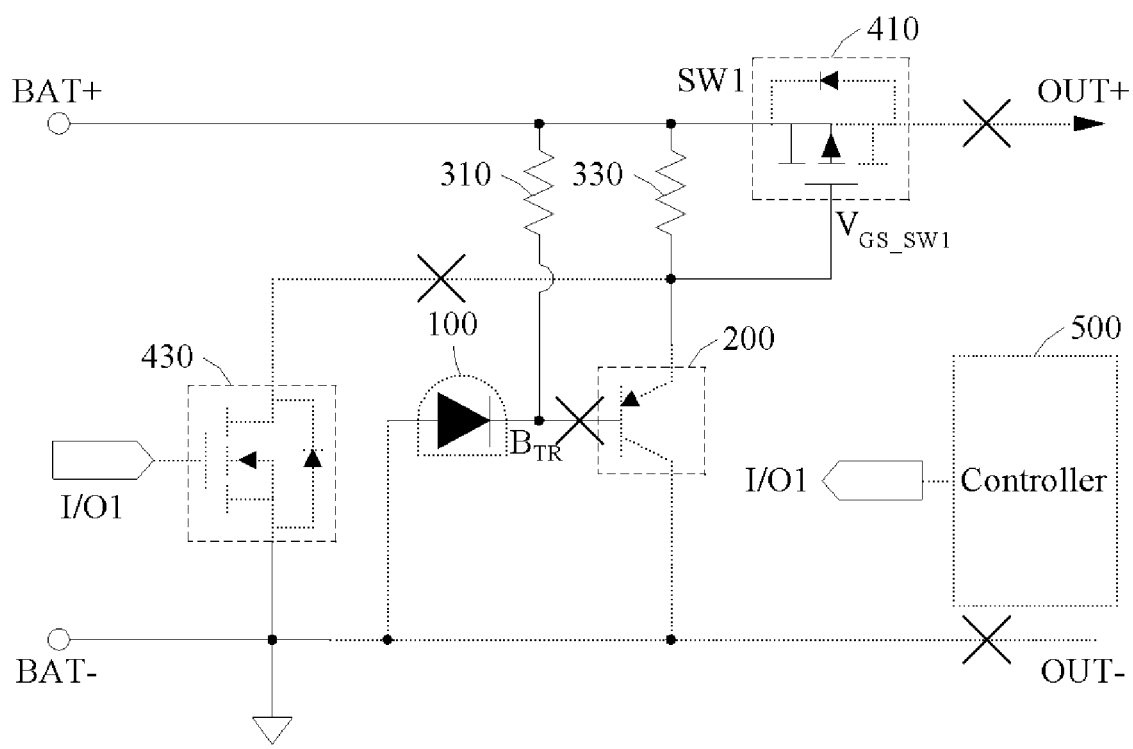
FIG. 6A illustrates an example of an operation performed when a power supply of a BMS is in an off state in the circuit diagram of FIG. 5A.
Figure 6B:
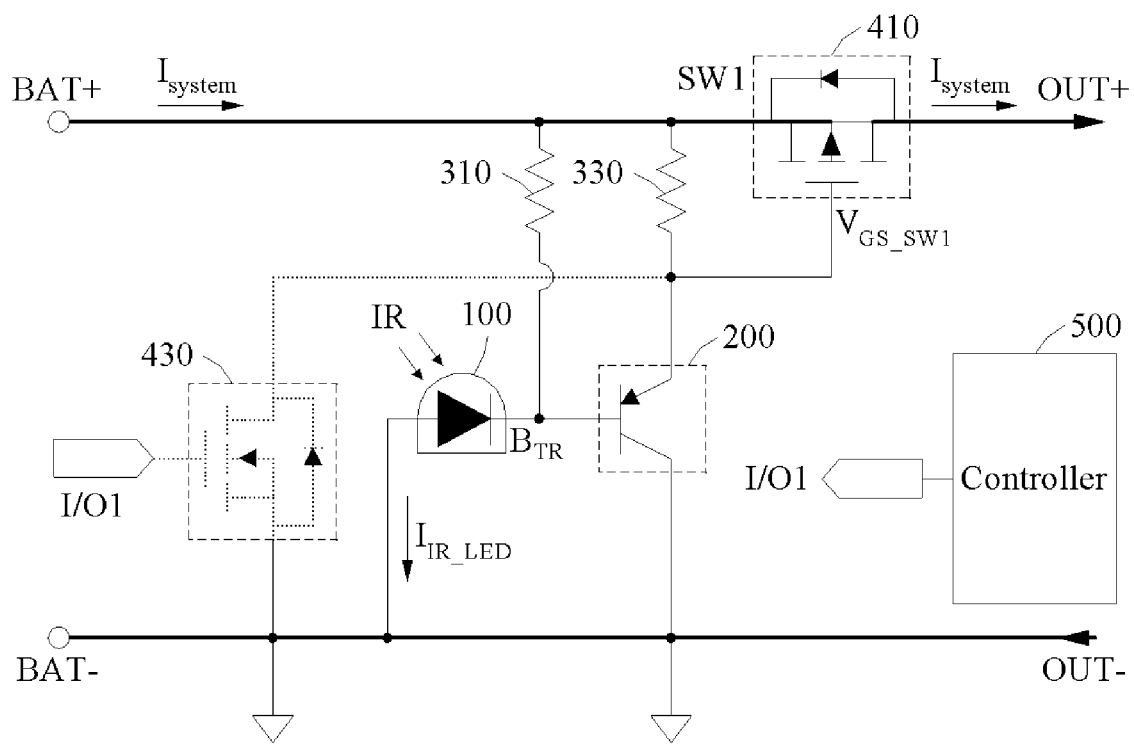
FIG. 6B illustrates an example of an operation performed when an optical signal is received in the circuit diagram of FIG. 5A.
Figure 6C:
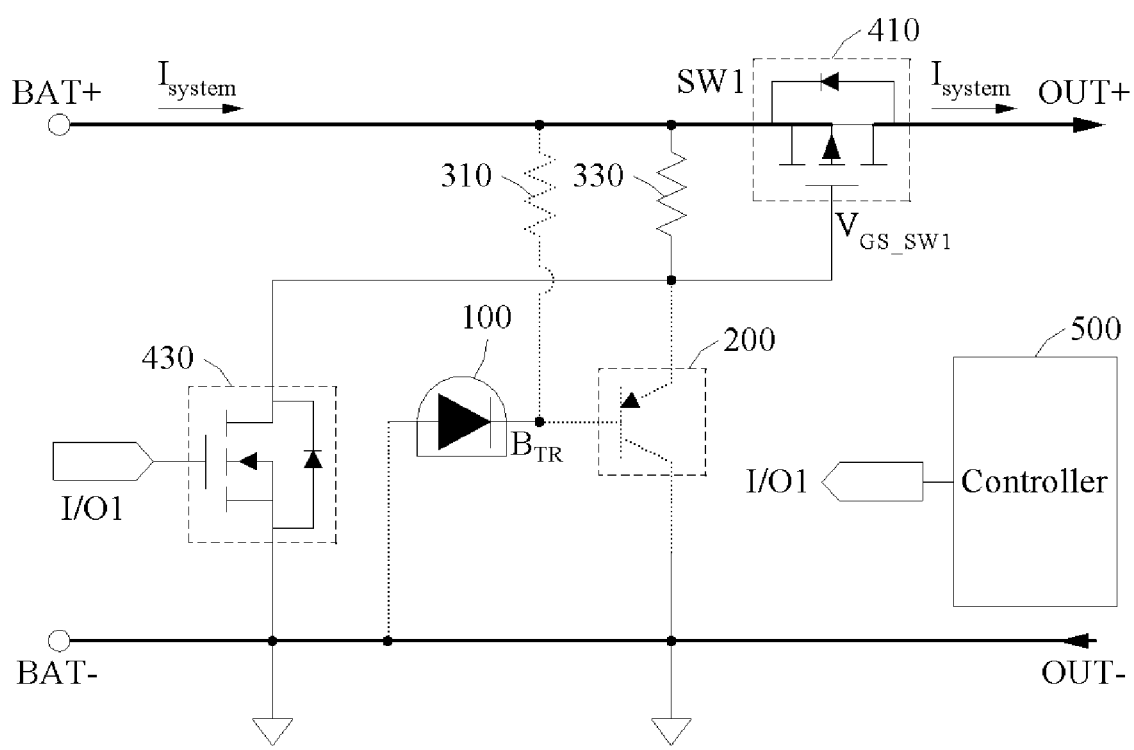
FIG. 6C illustrates an example of an operation performed when the power supply of the BMS is in an on state in the circuit diagram of FIG. 5A.

FIG. 6A illustrates an example of an operation performed when a power supply of a BMS is in an off state in the circuit diagram of FIG. 5A, FIG. 6B illustrates an example of an operation performed when an optical signal is received in the circuit diagram of FIG. 5A, and FIG. 6C illustrates an example of an operation performed when the power supply of the BMS is in an on state in the circuit diagram of FIG. 5A.

Referring to FIGS. 6A through 6C, an operation of the circuit of FIG. 5A will be described in a temporal order. The components in the circuit diagram of FIGS. 6A through 6C are the same as those of FIG. 5A. In addition to the description of FIGS. 6A through 6C below, the descriptions of FIGS. 1-5A are also applicable to FIGS. 6A through 6C and are incorporated herein by reference. Thus, the above description may not be repeated here. In FIGS. 6A through 6C, solid lines indicate wires through which a current flows, and broken lines indicate wires through which a current does not flow.

In an example, the BMS 20 operates in a standby mode (an off state, a shut-down state, or an idle state), a start-up mode, and an active mode (an on state or a normal state).

In the standby mode, the BMS power supply management apparatus 30 blocks power to be supplied to the BMS 20 such that a power consumption is "0".

When the optoelectronic element 100 receives an optical signal, the BMS power supply management apparatus 30 operates in the start-up mode and supplies a wake-up signal to the BMS 20.

The controller 500 receiving the wake-up signal controls the switch 400 of the BMS power supply management apparatus 30 to supply power to the BMS 20 such that the BMS 20 operates in the active mode.

FIG. 6A illustrates a state in which power is not supplied to the BMS 20 at all. In this example, no electric energy is supplied from the BMS power supply management apparatus 30 to the BMS 20.

The optoelectronic element 100 does not receive an optical signal, and thus does not generate a current. When the conversion element 200 is implemented as a BJT, no voltage is applied to a base, and thus the conversion element 200 does not generate a wake-up voltage. Thus, the first switch 410 is turned off to be open.

When the first switch 410 is open, a wake-up signal is not supplied from the battery 10 to the BMS 20, and the controller 500 does not operate.

Thus, the first control switch 430 does not operate as well, and no control signal is transmitted from the first control switch 430 to the first switch 410.

FIG. 6B illustrates an operation performed when the optoelectronic element 100 receives an optical signal. In the example of FIG. 6B, when the optoelectronic element 100 receives an optical signal, a current flows in the first resistor 310, and a voltage is applied to the conversion element 200 such that a wake-up voltage is generated.

The first switch 410 is turned on and shorted in response to the wake-up voltage, and a wake-up signal is supplied from the battery 10 to the controller 500 of the BMS power supply management apparatus 30. In this example, the controller 500 is yet to transmit a first control signal to the first control switch 430 such that the first control switch 430 does not operate.

In the example of FIG. 6C, the controller 500 supplies a first control signal to the first control switch 430 such that the first control switch 430 is turned on. Thus, the first control switch 430 supplies a voltage to the first switch 410 such that the first switch 410 is completely turned on to short an electrical path between the battery 10 and the BMS 20.

In the example of FIG. 6C, the first switch 410 is controlled by the controller 500, and the optoelectronic element 100 does not receive any further optical signal. Thus, a current does not flow in the optoelectronic element 100, the conversion element 200, and the first resistor 310.

Figure 7A:
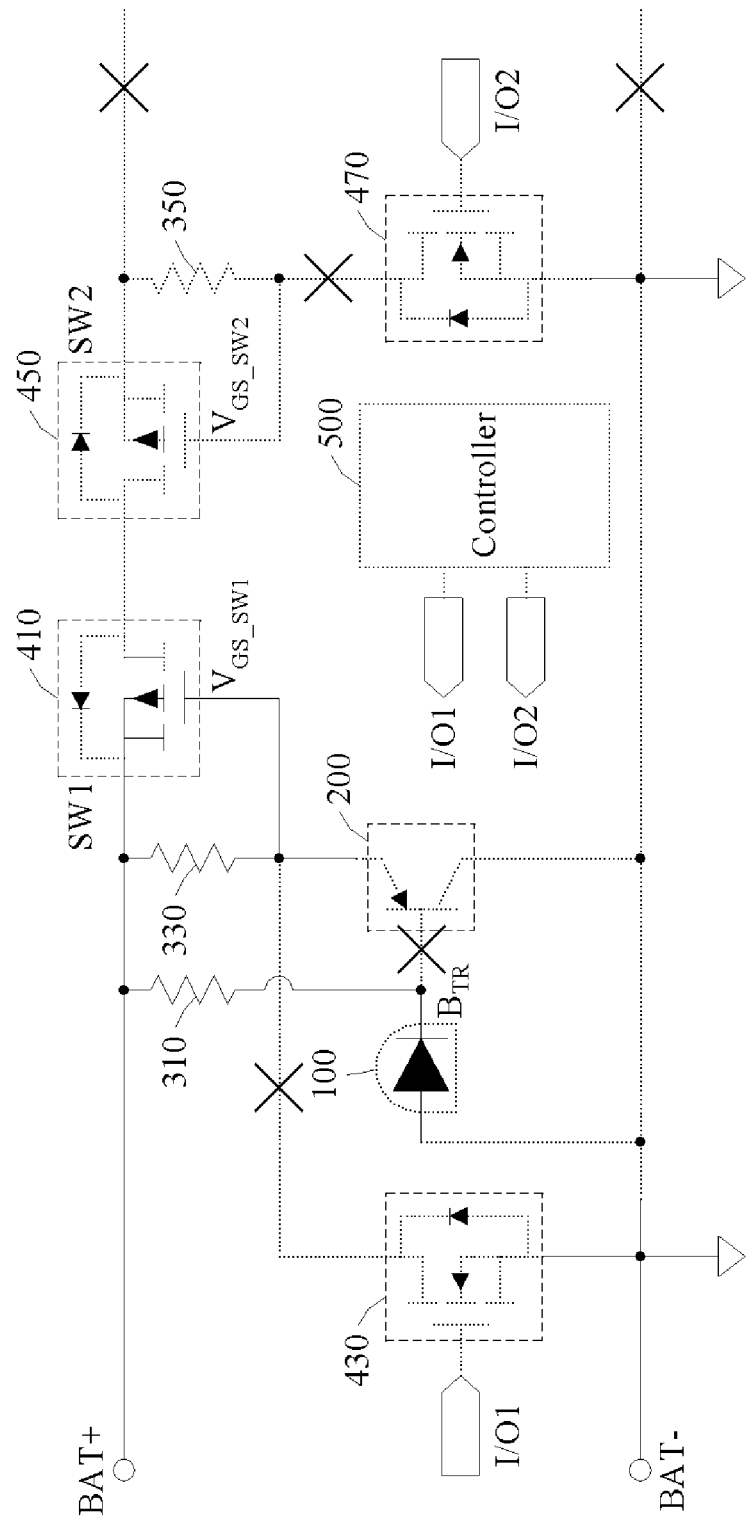
FIG. 7A illustrates an example of an operation performed when a power supply of a BMS is in an off state in the circuit diagram of FIG. 5B.
Figure 7B:
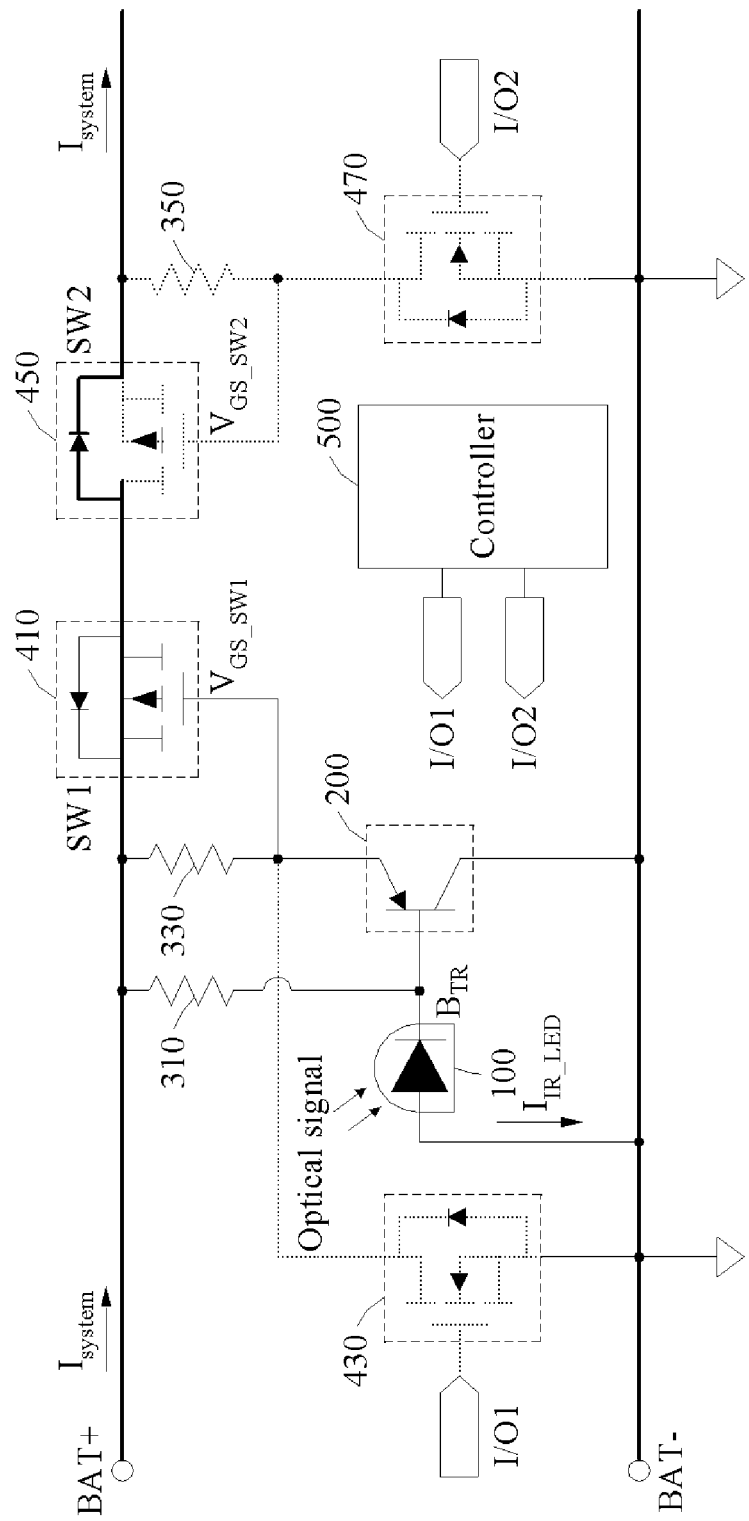
FIG. 7B illustrates an example of an operation performed when an optical signal is received in the circuit diagram of FIG. 5B.
Figure 7C:
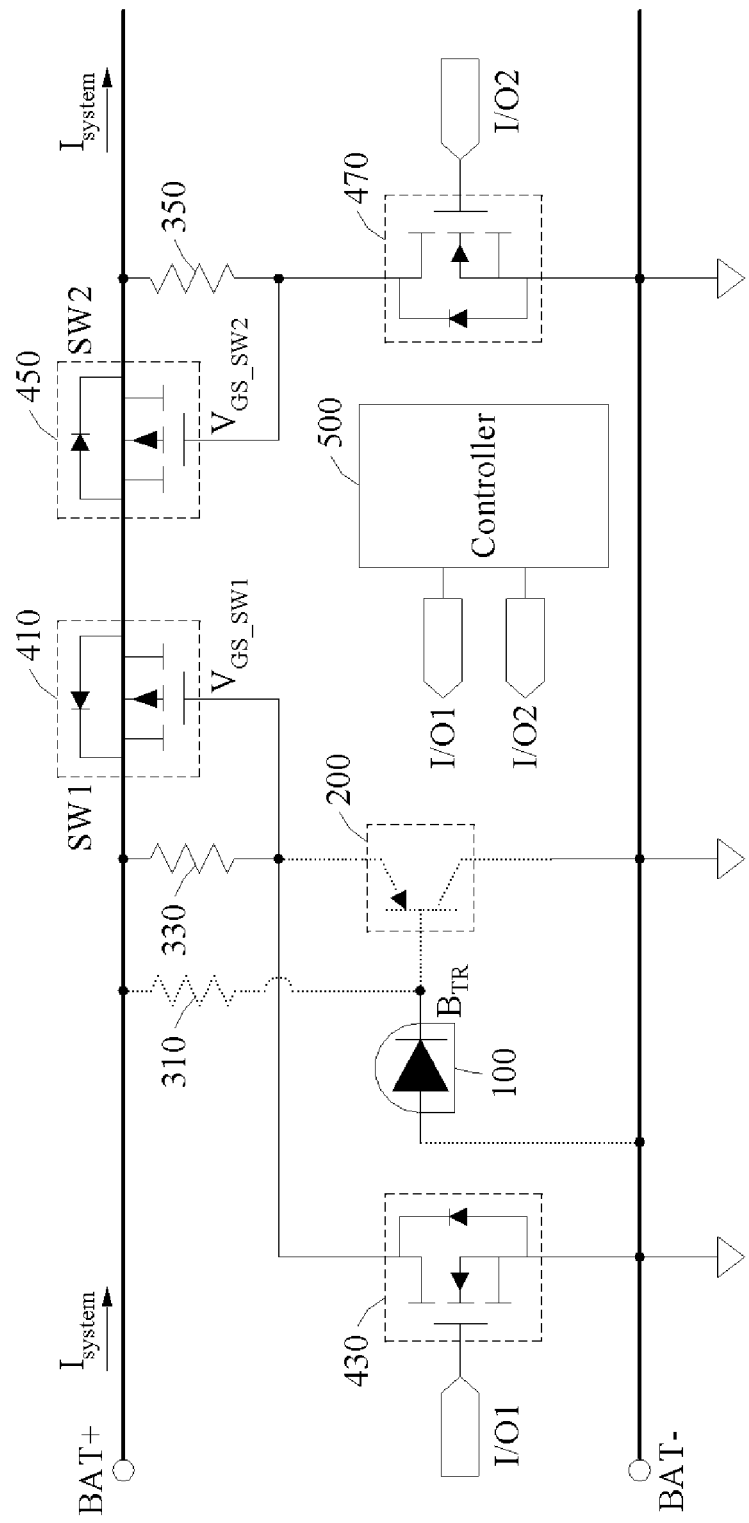
FIG. 7C illustrates an example of an operation performed when the power supply of the BMS is in an on state in the circuit diagram of FIG. 5B.

FIG. 7A illustrates an example of an operation performed when a power supply of a BMS is in an off state in the circuit diagram of FIG. 5B, FIG. 7B illustrates an example of an operation performed when an optical signal is received in the circuit diagram of FIG. 5B, and FIG. 7C illustrates an example of an operation performed when the power supply of the BMS is in an on state in the circuit diagram of FIG. 5B. In addition to the description of FIGS. 7A through 7C below, the descriptions of FIGS. 1-6C are also applicable to FIGS. 7A through 7C and are incorporated herein by reference. Thus, the above description may not be repeated here.

Referring to FIGS. 7A through 7C, an operation of the circuit of FIG. 5B will be described in a temporal order. The components in the circuit diagram of FIGS. 7A through 7C are the same as those of FIG. 5B. In FIGS. 7A through 7C, solid lines indicate wires through which a current flows, and broken lines indicate wires through which a current does not flow.

FIG. 7A illustrates a state in which power is not supplied to the BMS 20 at all. In this example, no electric energy is supplied from the BMS power supply management apparatus 30 to the BMS 20.

The optoelectronic element 100 does not receive an optical signal, and thus does not generate a current. When the conversion element 200 is implemented as a BJT, no voltage is applied to a base, and thus the conversion element 200 does not generate a wake-up voltage. Thus, the first switch 410 is turned off to be open.

When the first switch 410 is open, a wake-up signal is not supplied from the battery 10 to the BMS 20 such that the controller 500 does not operate.

Thus, the first control switch 430 and the second control switch 470 do not operate as well such that no control signal is transmitted from the first control switch 430 to the first switch 410, and no control signal is transmitted from the second control switch 470 to the second switch 450.

FIG. 7B illustrates an operation performed when the optoelectronic element 100 receives an optical signal. In the example of FIG. 7B, when the optoelectronic element 100 receives an optical signal, a current flows in the first resistor 310, and a voltage is applied to the conversion element 200 such that a wake-up voltage is generated.

The first switch 410 is turned on and shorted in response to the wake-up voltage, and a wake-up signal is supplied from the battery 10 through the second switch 450 to the controller 500 of the BMS power supply management apparatus 30. In this example, the controller 500 is yet to transmit a first control signal to the first control switch 430 such that thus the first control switch 430 does not operate.

Further, when the second switch 450 is implemented as an FET, the FET is not turned on such that the wake-up signal flows through a body diode of the FET.

In the example of FIG. 7C, the controller 500 supplies a first control signal to the first control switch 430 such that the first control switch 430 is turned on, and a current flows in the third resistor 350. The controller 500 supplies a second control signal to the second control switch 470 such that the second control switch 470 is turned on.

Thus, the first control switch 430 supplies a voltage to the first switch 410 such that the first switch 410 is completely turned on, and the second control switch 470 supplies a voltage to the second switch 450 such that the second switch 450 is completely turned on. Through this, the first switch 410 and the second switch 450 short an electrical path between the battery 10 and the BMS 20.

In the example of FIG. 7C, the first switch 410 is controlled by the controller 500, and the optoelectronic element 100 does not receive any further optical signal. Thus, a current does not flow in the optoelectronic element 100, the conversion element 200, and the first resistor 310.

Figure 8:
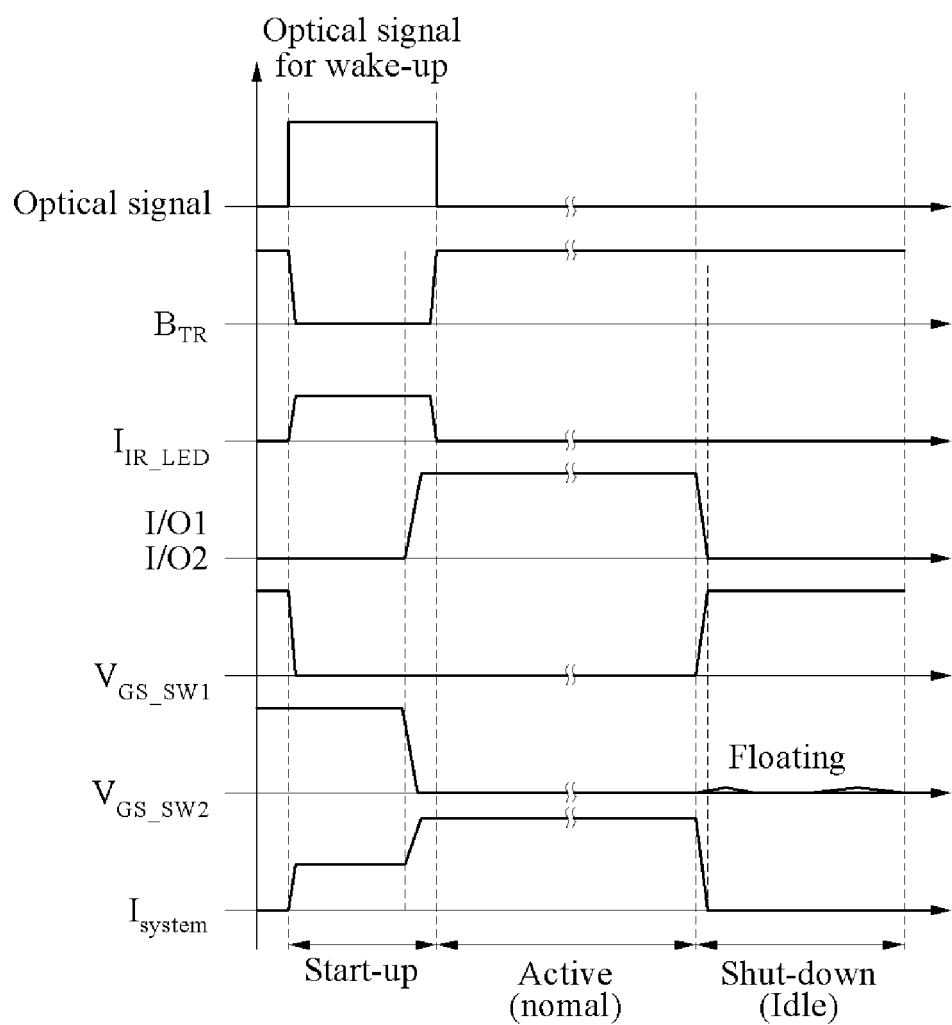
FIG. 8 illustrates an example of a timing diagram of various signals of a BMS power supply management apparatus.

FIG. 8 illustrates an example of a timing diagram of various signals of a BMS power supply management apparatus.

Referring to FIG. 8, the optoelectronic element 100 receives an optical signal and starts up an operation of the BMS power supply management apparatus 30.

In the timing diagram of FIG. 8, $B_{TR}$ denotes a base voltage of the conversion element 200, and $I_{IR\_LED}$ denotes a current generated by the optoelectronic element 100. I/O1 denotes a first control signal, and I/O2 denotes a second control signal.

$V_{GS-SW1}$ denotes a voltage applied between a gate and a source of the first switch 410, and $V_{GS\_SW2}$ denotes a voltage applied between a gate and a source of the second switch 450. $I_{system}$ denotes a current flowing from the battery 10 to the BMS 20. $I_{system}$ denotes a wake-up signal in a start-up state.

When the optoelectronic element 100 receives an optical signal, the optoelectronic element 100 generates a current. The generated current causes a change in the base voltage $B_{TR}$ of the conversion element 200.

The conversion element 200 is turned on such that a current is generated between an emitter and a collector, and the emitter-collector current flows along the second resistor 330 and generates a wake-up voltage. A voltage is applied to the gate of the first switch 410 in response to the wake-up voltage such that a voltage $V_{GS-SW1}$ is applied between the gate and the source of the first switch 410.

A wake-up signal flows between the source and a drain of the first switch 410 in response to the wake-up voltage, and the controller 500 is woken up by the wake-up signal such that the BMS 20 enters an active or normal state.

When the BMS 20 enters the active state, the controller 500 transmits a first control signal and a second control signal to the first control switch 430 and the second control switch 470 such that the first switch 410 and the second switch 450 are completely turned on.

Thus, $I_{system}$ increases, and power is stably supplied to the BMS 20.

When a power supply of the BMS 20 is turned off, the first control signal and the second control signal change to "0". Thus, gate potentials of the first switch 410 and the second switch 450 are restored to a level before a start-up such that the first switch 410 and the second switch 450 are turned off to be open.

Thus, $I_{system}$ becomes "0", and power is not supplied to the BMS 20 any further, whereby the standby power is completely eliminated.

Figure 9A:
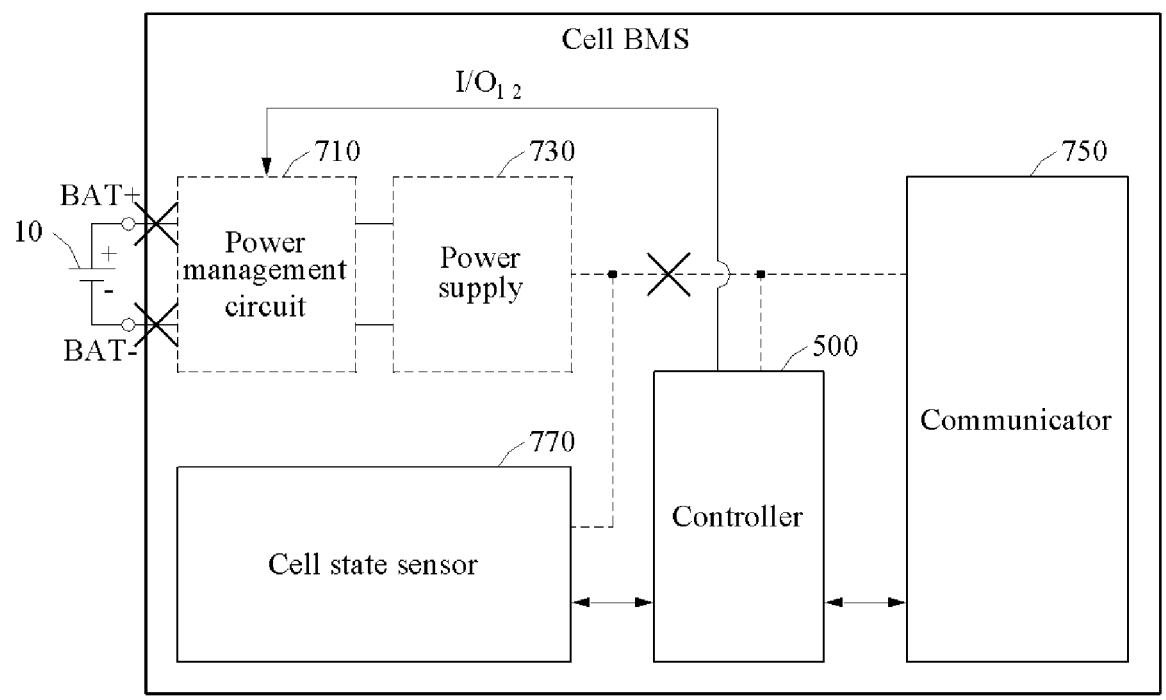
FIG. 9A illustrates an example of an operation performed when a power supply of a BMS shown in FIG. 1 is in an off state.
Figure 9B:
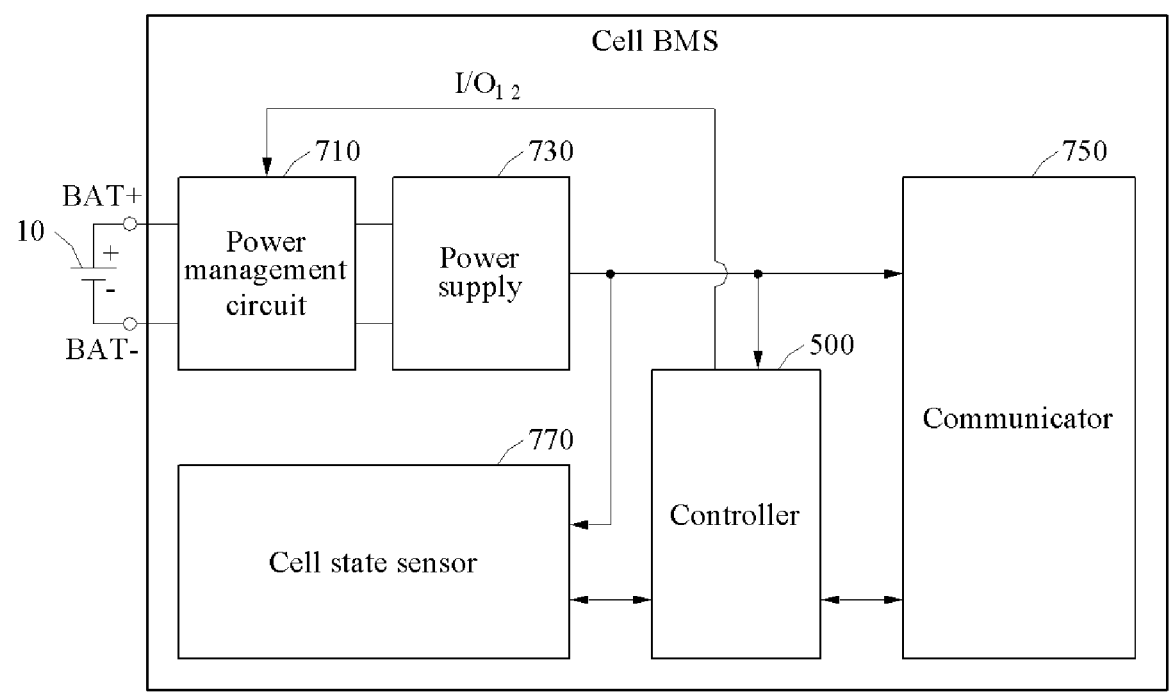
FIG. 9B illustrates an example of an operation performed when the power supply of the BMS shown in FIG. 1 is in an on state.

FIG. 9A illustrates an example of an operation performed when a power supply of a BMS shown in FIG. 1 is in an off state, and FIG. 9B illustrates an example of an operation performed when the power supply of the BMS shown in FIG. 1 is in an on state.

Referring to FIGS. 9A and 9B, the BMS 20 includes a power management circuit 710, a power supply 730, a communicator 750, a cell state sensor 770, and the controller 500.

In this example, the BMS power supply management apparatus 30 includes the power management circuit 710, the communicator 750, and the controller 500. The power management circuit 710 includes the conversion element 200, the resistor 300, and the switch 400 described above, and the communicator 750 is implemented to include the optoelectronic element 100. In addition to the description of FIGS. 9A-9B below, the descriptions of FIGS. 1-8 are also applicable to FIGS. 9A-9B and are incorporated herein by reference. Thus, the above description may not be repeated here.

The power management circuit 710 controls the power supply 730 by switching a current flowing from the battery 10 to the controller 500.

The power supply 730 supplies power to the cell state sensor 770, the controller 500, and the communicator 750.

The communicator 750 transmits and receives information related to the battery 10 to and from another BMS adjacent to the BMS 20. An operation of the communicator 750 will be further described in detail with reference to FIGS. 10A and 10B.

The cell state sensor 770 senses a state of the battery 10. The state of the battery 10 includes any one or any combination of a voltage applied to both ends of the battery 10, a current flowing in the battery 10, and a temperature of the battery 10.

Depending on an implementation, the controller 500 estimates a charging state, for example, a state of charge (SOC) and a state of health (SOH), of the battery 10 based on the state of the battery 10.

When the BMS 20 is in a standby mode or an off state, the BMS 20 operates as shown in FIG. 9A. When the BMS 20 is in the off state, the controller 500 controls the switch 400 of the power management circuit 710 to block power supplied from the power supply 730 to the controller 500 and the cell state sensor 770.

When the BMS 20 is in an active mode or an on state, the controller 500 controls the switch 400 of the power management circuit 710 such that the power supply 730 supplies power to the components of the BMS 20.

An operation of the controller 500 controlling the first switch 410, the first control switch 430, the second switch 450, and the second control switch 470 included in the switch 400 is the same as the description provided above.

Figure 10A:
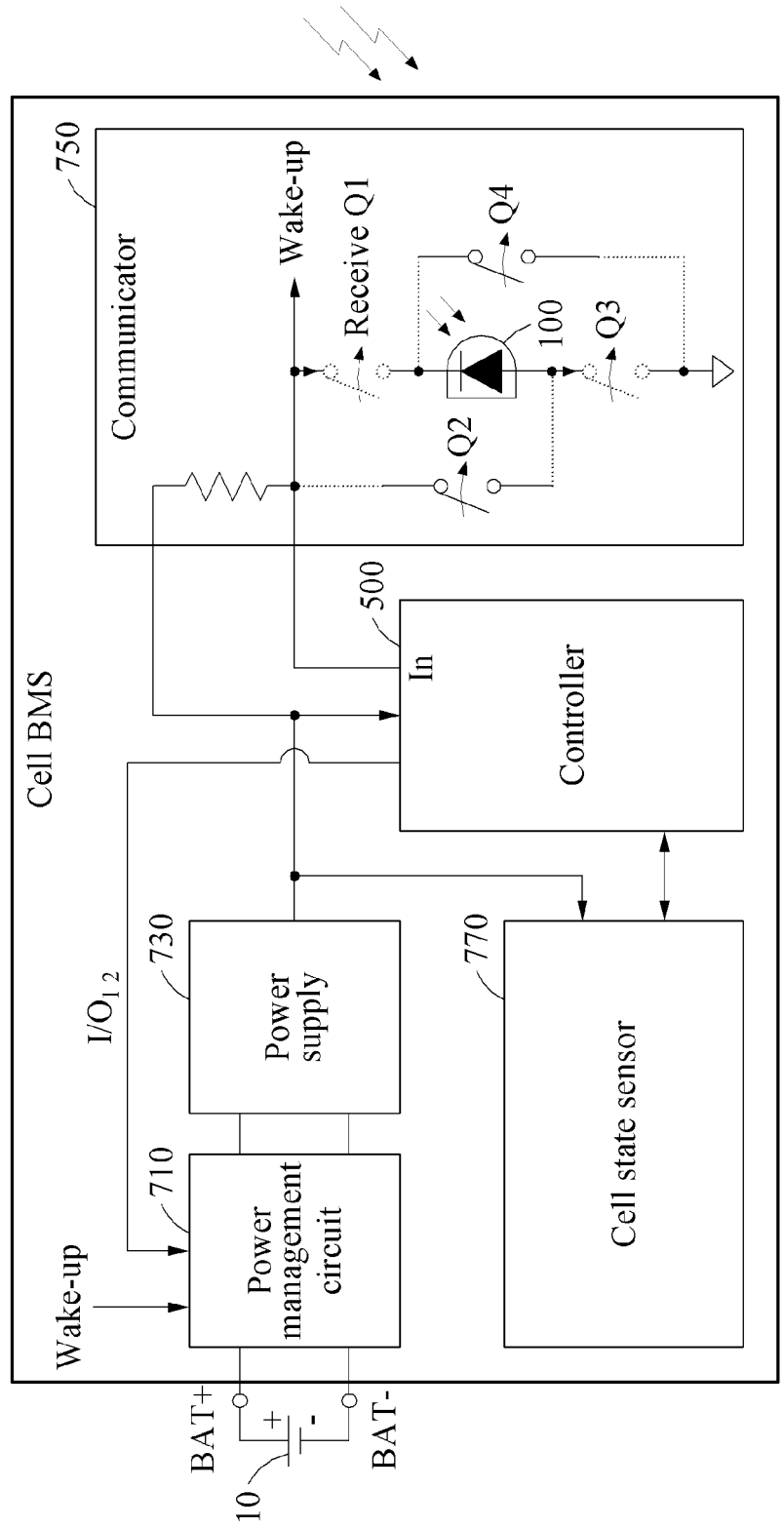
FIG. 10A illustrates an example of an operation performed when a communicator shown in FIGS. 9A and 9B receives an optical signal.
Figure 10B:
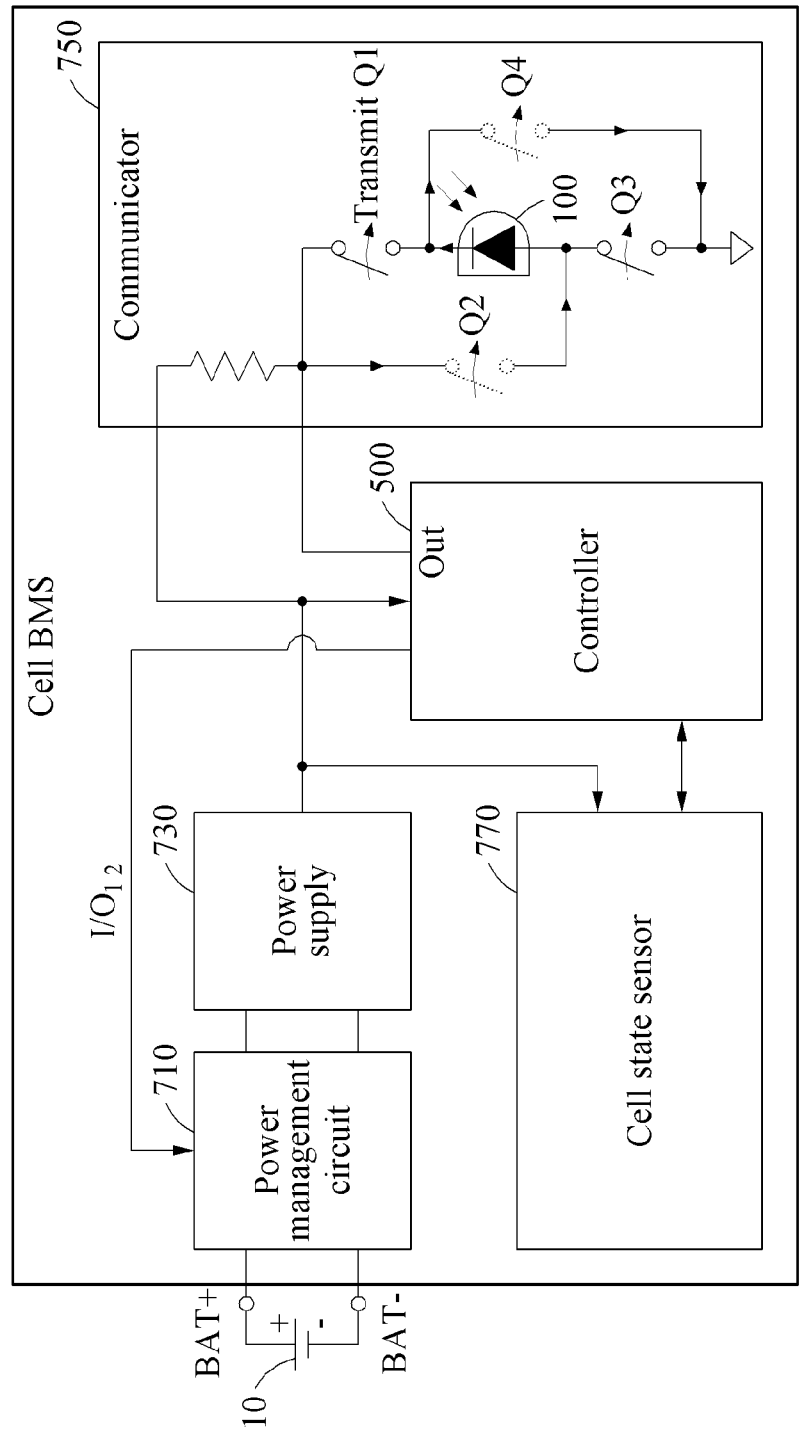
FIG. 10B illustrates an example of an operation performed when the communicator shown in FIGS. 9A and 9B transmits an optical signal.

FIG. 10A illustrates an example of an operation performed when a communicator shown in FIGS. 9A and 9B receives an optical signal, and FIG. 10B illustrates an example of an operation performed when the communicator shown in FIGS. 9A and 9B transmits an optical signal. In addition to the description of FIGS. 10A-10B below, the descriptions of FIGS. 1-9B are also applicable to FIGS. 10A-10B and are incorporated herein by reference. Thus, the above description may not be repeated here.

Referring to FIGS. 10A and 10B, operations of the power management circuit 710, the power supply 730, the cell state sensor 770, and the controller 500 are the same as those described with reference to FIGS. 9A and 9B.

The communicator 750 includes four switches Q1, Q2, Q3 and Q4, and the optoelectronic element 100. For example, the optoelectronic element 100 is implemented as an IR LED as described above.

The communicator 750 performs a communication between another adjacent BMS and the BMS 20. For example, the communicator 750 performs the communication between the BMSes using optical signals.

FIG. 10A illustrates an operation performed when the communicator 750 receives an optical signal, and FIG. 10B illustrates an operation performed when the communicator 750 transmits an optical signal. When an optical signal is received, the switch Q1 and the switch Q3 of the communicator 750 are shorted, and the switch Q2 and the switch Q4 of the communicator 750 are open, whereby a path along which a current flows from the optoelectronic element 100 is generated.

When an optical signal is transmitted, the switch Q1 and the switch Q3 of the communicator 750 are open, and the switch Q2 and the switch Q4 of the communicator 750 are shorted, whereby the optoelectronic element 100 transmits an optical signal to another adjacent BMS.

Figure 11:
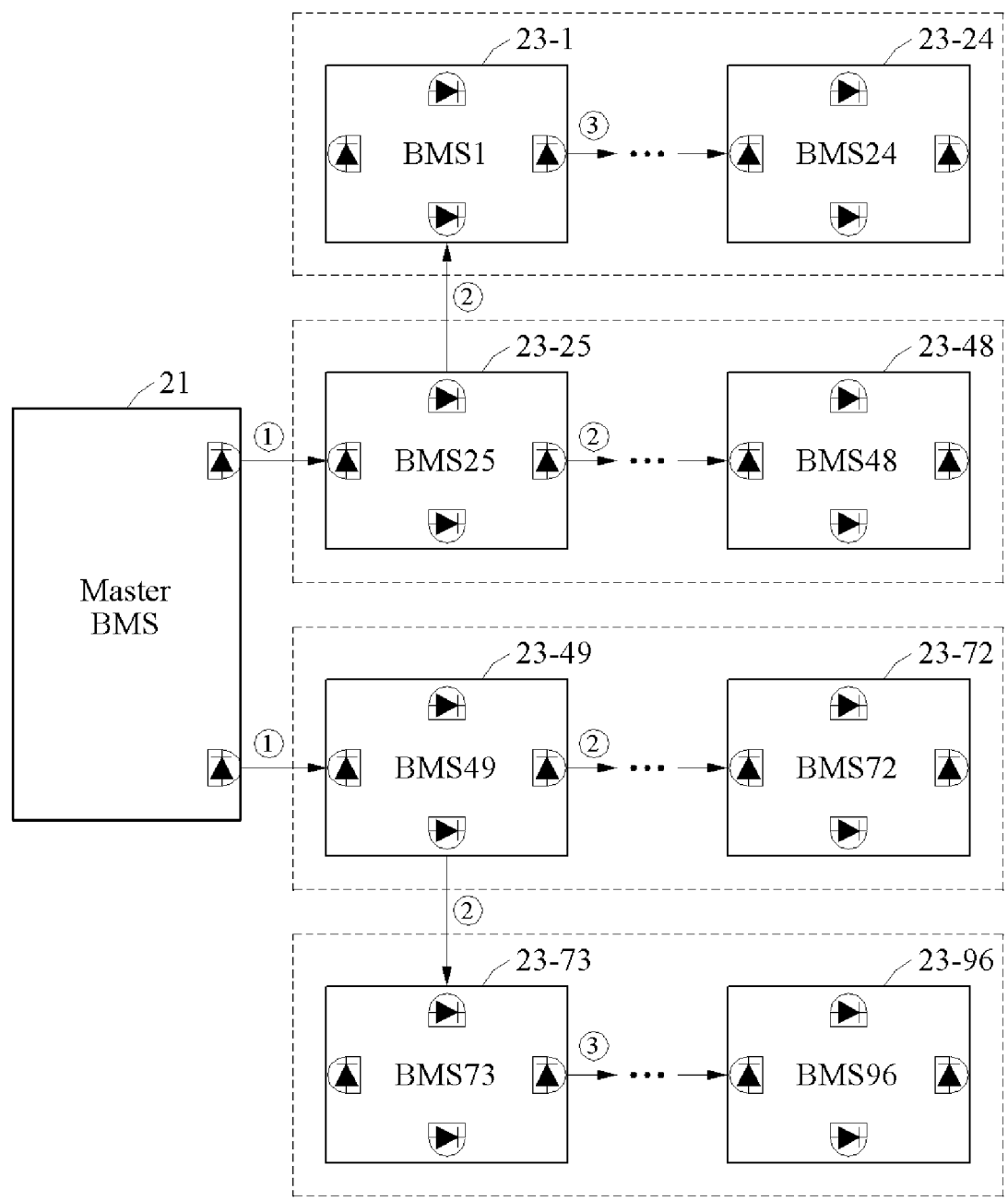
FIG. 11 illustrates an example of managing a power supply through an optical signal in a battery including a plurality of battery cells.

FIG. 11 illustrates an example of managing a power supply through an optical signal in a battery including a plurality of battery cells.

Referring to FIG. 11, the battery 10 includes a plurality of battery cells. In this example, the entire BMS 20 includes a master BMS 21, and a plurality of slave BMSes 23-1 through 23-96 corresponding to the plurality of battery cells.

The master BMS 21 and the plurality of slave BMSes 23-1 through 23-96 corresponding to the plurality of battery cells each include the BMS power supply management apparatus 30.

An operation of each BMS power supply management apparatus 30 is the same as that described above and are incorporated herein by reference. Thus, the above description may not be repeated here.

In the example of FIG. 11, the battery 10 includes 96 battery cells, the master BMS 21, and 96 slave BMSes 23-1 through 23-96.

Each of the master BMS 21 and the 96 slave BMSes 23-1 through 23-96 includes at least one optoelectronic element 100.

For example, the master BMS 21 includes two optoelectronic elements 100, and each of the 96 slave BMSes 23-1 through 23-96 includes four optoelectronic elements 100. The number and positions of optoelectronic elements 100 vary depending on the arrangement of battery cells and the shape of the battery cells.

When the plurality of BMSes 23-1 through 23-96 is in a standby mode or an off state, the BMS power supply management apparatuses 30 included in the respective BMSes eliminate a consumption of standby power by controlling the switch 400 to block a supply of power.

The master BMS 21 transmits an optical signal to the slave BMSes 23-1 through 23-96 to change modes of the slave BMSes 23-1 through 23-96 to an active mode or an on state.

In this example, the optical signal is transmitted to at least one of the slave BMSes 23-1 through 23-96. For example, the optical signal is transmitted to the slave BMS 23-25 and the slave BMS 23-49 as shown in FIG. 11.

The slave battery cells 23-25 and 23-49 receiving the optical signal transition to the active mode or the on state by controlling the switch 400 based on controls of the respective BMS power supply management apparatuses 30.

The slave BMSes 23-25 and 23-49 transitioning to the active mode transmit an optical signal again to adjacent slave BMSes 23-1, 23-26, 23-50 and 23-73 in response to a control of the controller 500.

In the similar manner, an optical signal is transmitted to all of the plurality of slave BMSes 23-1 through 23-96 such that the plurality of slave BMSes 23-1 through 23-96 sequentially or concurrently transitions to the active mode.

Figure 12A:
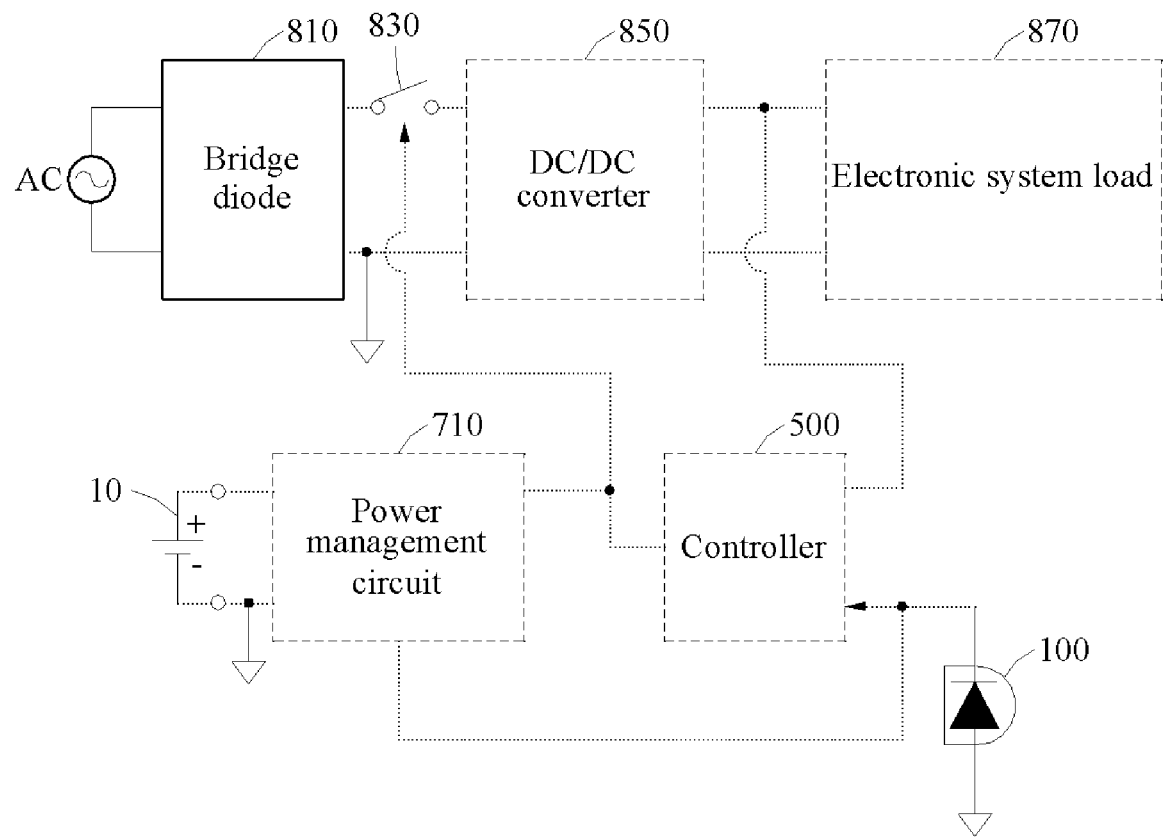
FIG. 12A illustrates an example of an operation performed by a BMS power supply management apparatus when a power supply of a BMS is in an off state.
Figure 12B:
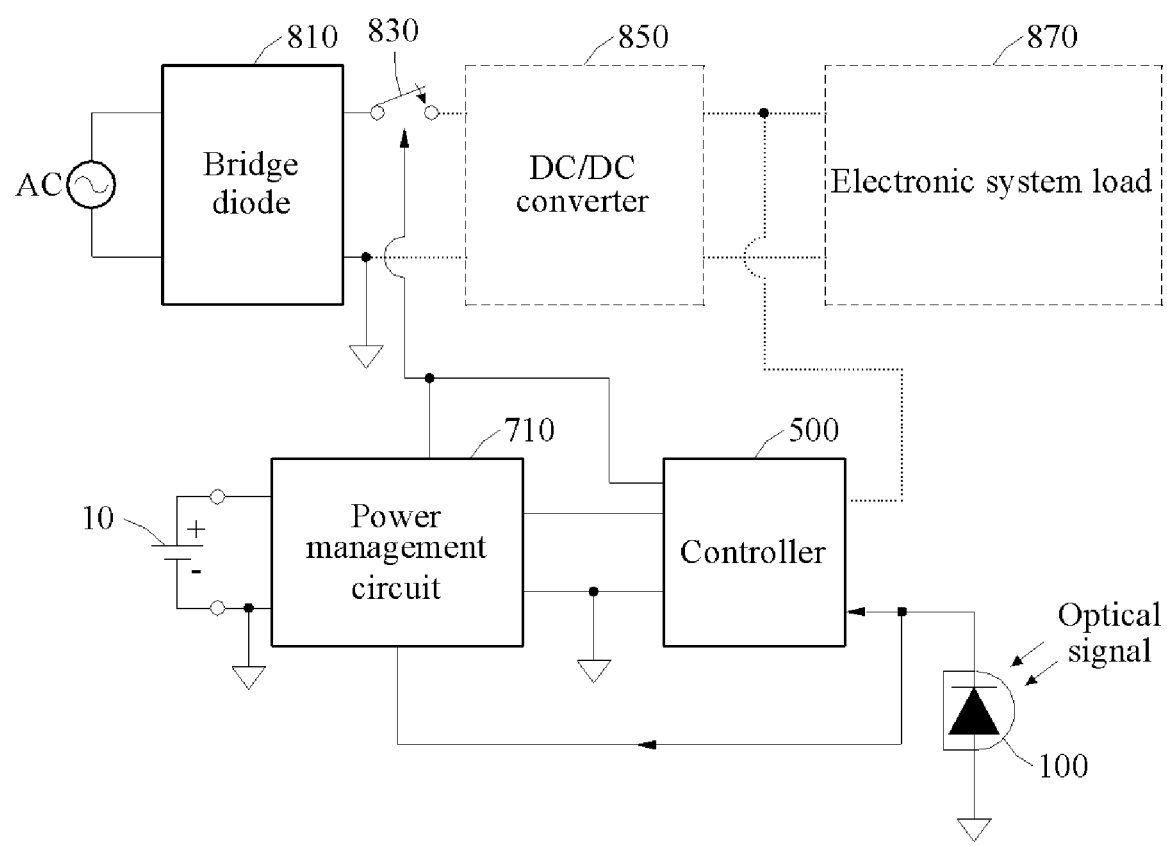
FIG. 12B illustrates an example of an operation performed by a BMS power supply management apparatus when an optical signal is received.

FIG. 12A illustrates an example of an operation performed by a BMS power supply management apparatus when a power supply of a BMS is in an off state, and FIG. 12B illustrates an example of an operation performed by the BMS power supply management apparatus when an optical signal is received.

Figure 12C:
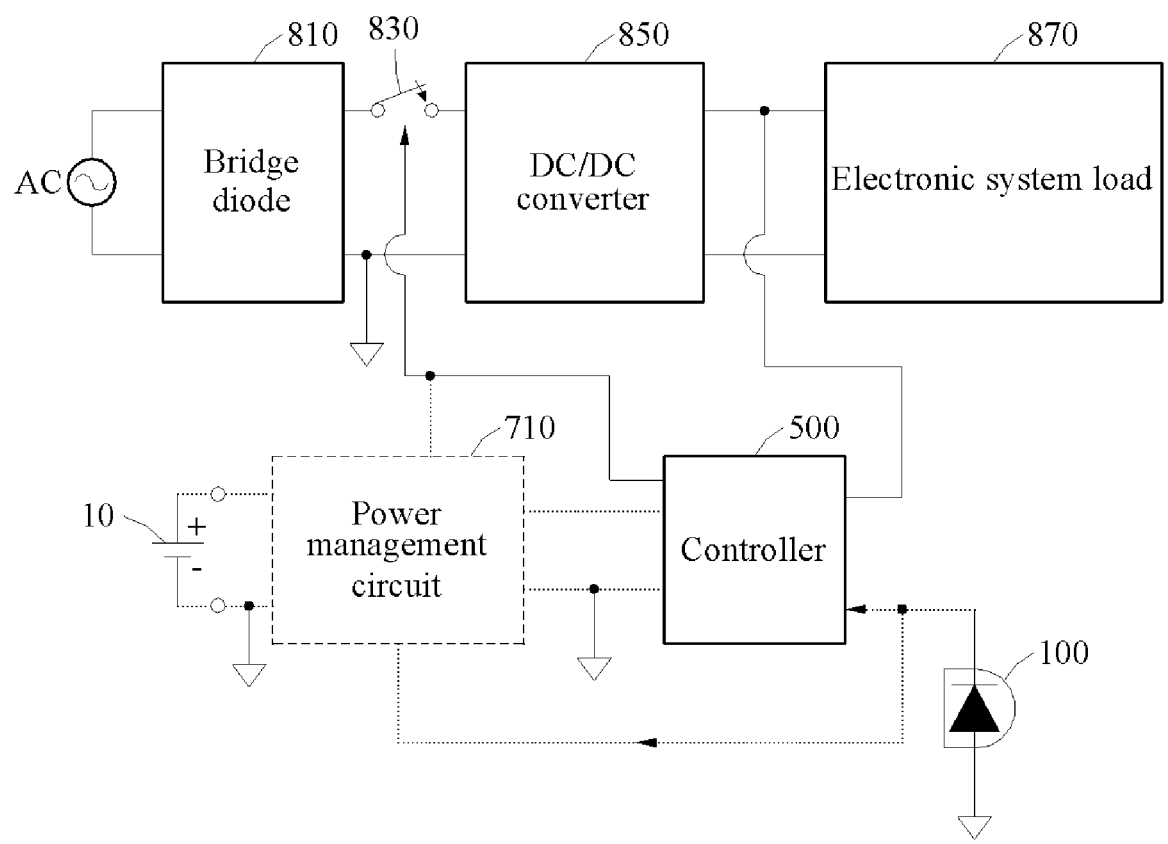
FIG. 12C illustrates an example of an operation performed by a BMS power supply management apparatus when a power supply of a BMS is in an on state.
Figure 12D:
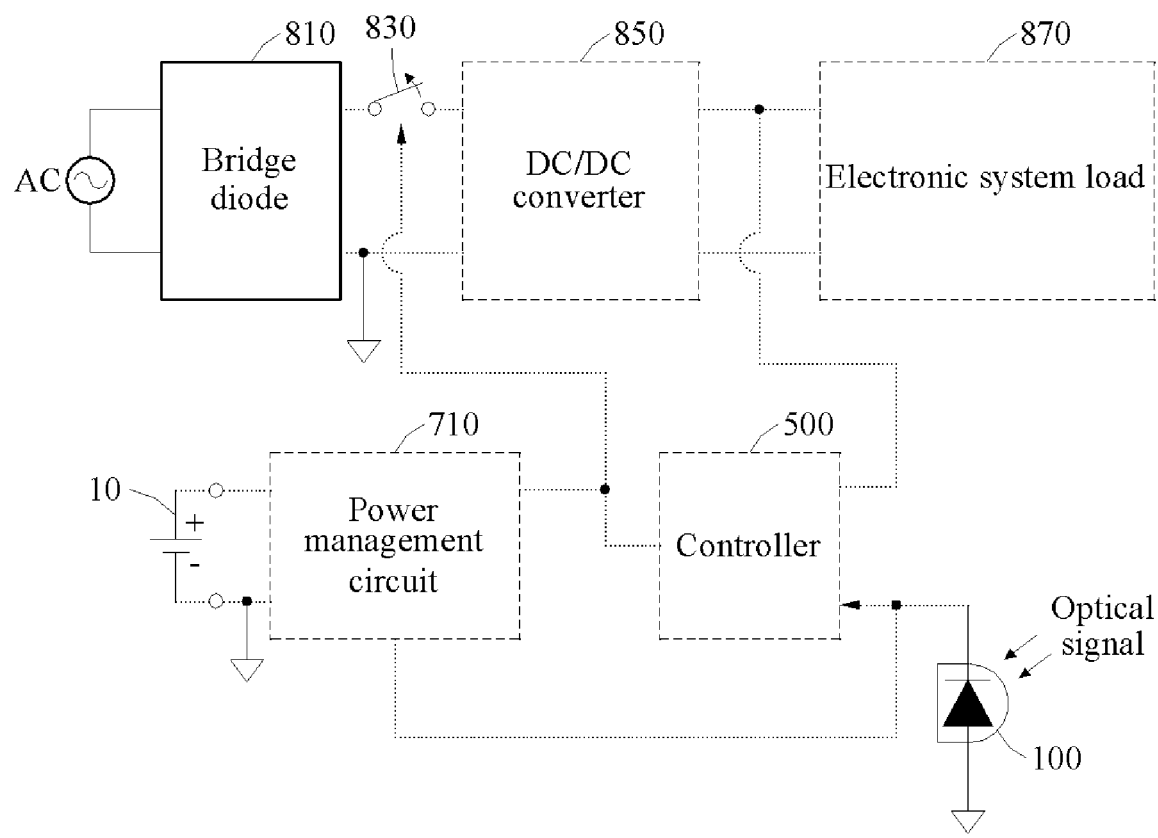
FIG. 12D illustrates an example of turning off a power supply of a BMS again in a BMS power supply management apparatus.

FIG. 12C illustrates an example of an operation performed by the BMS power supply management apparatus when the power supply of the BMS is in an on state, and FIG. 12D illustrates an example of turning off the power supply of the BMS again in the BMS power supply management apparatus.

Referring to FIGS. 12A through 12D, the BMS 20 is connected to the battery 10. The BMS 20 includes a bridge diode 810, a power switch 830, a DC/DC converter 850, an electronic system load 870, the power management circuit 710, the controller 500, and the optoelectronic element 100.

In FIGS. 12A through 12D, the battery 10 includes an auxiliary battery. A configuration and an operation of the power management circuit 710 are the same as the description provided with reference to FIG. 9A.

In FIG. 12A, when the BMS 20 is in an off state before the optoelectronic element 100 transmits an optical signal, power is not supplied to the DC/DC converter 850, the electronic system load 870, the power management circuit 710, and the controller 500 such that standby power is not consumed.

In FIG. 12B, when the optoelectronic element 100 receives an optical signal, the power management circuit 710 operates in a start-up state and supplies power to the controller 500 such that the controller 500 controls the power switch 830.

In FIG. 12C, when the controller 500 completely operates in an active mode, the power switch 830 is shorted such that power is stably supplied to the DC/DC converter 850 and the electronic system load 870.

In FIG. 12D, when the BMS 20 operates in an off state again, the power switch 830 is open such that the supply of power to the DC/DC converter 850 and the electronic system load 870 is suspended. Further, the supply of power to the power management circuit 710 and the controller 500 is also blocked such that standby power is minimized.

Figure 13:
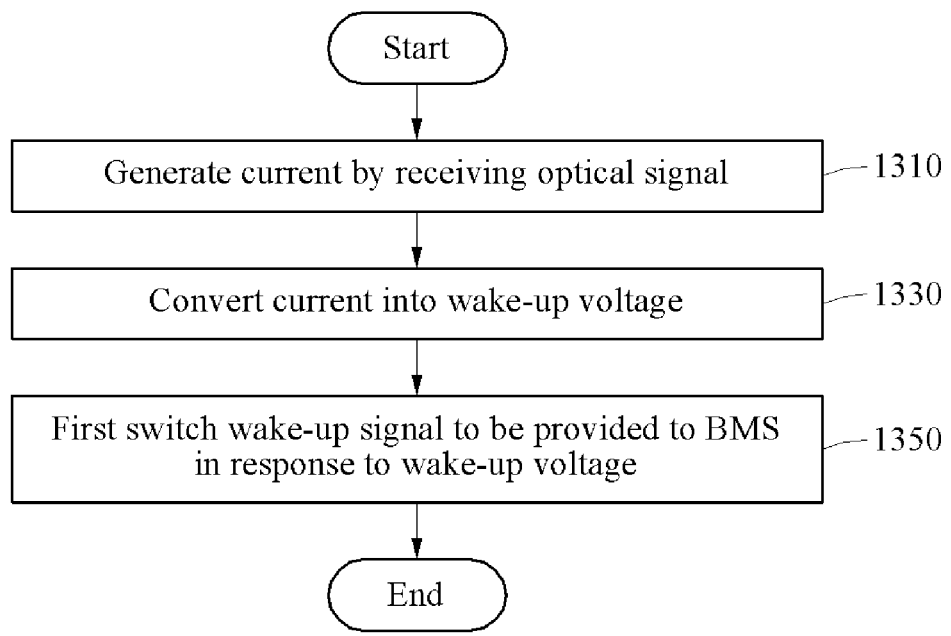
FIG. 13 illustrates an example of an operation of the BMS power supply management apparatus shown in FIG. 1.

FIG. 13 illustrates an example of an operation of the BMS power supply management apparatus shown in FIG. 1. The operations in FIG. 13 may be performed in the sequence and manner as shown, although the order of some operations may be changed or some of the operations omitted without departing from the spirit and scope of the illustrative examples described. Many of the operations shown in FIG. 13 may be performed in parallel or concurrently. One or more blocks of FIG. 13, and combinations of the blocks, can be implemented by special purpose hardware-based computer, and devices such as a processor, that perform the specified functions, or combinations of special purpose hardware and computer instructions. In addition to the description of FIG. 13 below, the descriptions of FIGS. 1-12 is also applicable to FIG. 13 and are incorporated herein by reference. Thus, the above description may not be repeated here.

Referring to FIG. 13, in operation 1310, the optoelectronic element 100 generates a current by receiving an optical signal. In an example, the optoelectronic element 100 outputs an optical signal to a BMS adjacent to the BMS 20. The optoelectronic element 100 includes an IR LED, and generates the current from an infrared ray received through the IR LED.

In operation 1330, the conversion element 200 converts the generated current into a wake-up voltage. The conversion element 200 converts the generated current into the wake-up voltage through the first resistor 310 connected to one end of the optoelectronic element 100 generating the current and one end of the battery 10.

Due to a current flowing through the conversion element 200, the wake-up voltage is applied to the second resistor 330 connected to one end of the conversion element 200 generating the wake-up voltage and one end of the battery 10.

In operation 1350, the first switch 410 first switches a wake-up signal to be provided to the BMS 20 in response to the wake-up voltage. The second switch 450 second switches the first switched wake-up signal.

The first switch 410 first switches the wake-up signal based on the wake-up voltage applied to the second resistor 330. The wake-up signal is supplied to the controller 500 in response to switching of the first switch 410 and/or the second switch 450.

The controller 500 controls the first switch 410 to provide power to the BMS 20 based on the wake-up signal. The controller 500 supplies the power to the BMS 20 by shorting the first switch 410 based on the wake-up signal.

The controller 500 generates a first control signal to control the first switch 410. The controller 500 controls the first switch 410 based on the first control signal.

The controller 500 generates a second control signal to control the second switch 450 to perform the second switching. The controller 500 controls the second switch 450 based on the second control signal.

The BMS power supply management apparatus 30, controller 500, communicator 750, and other apparatuses, units, modules, devices, and other components described herein with respect to FIGS. 1-13 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the BMS power supply management method. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, card type memory such as multimedia card, secure digital (SD) card, or extreme digital (XD) card, magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management system (BMS) power supply management apparatus, comprising:
   an optoelectronic element configured to generate a current in response to an optical signal;
   a conversion element configured to convert the current into a wake-up voltage;
   a first switch configured to switch a wake-up signal for a BMS, in response to the wake-up voltage;
   a second resistor connected to the conversion element and a battery such that the wake-up voltage is applied thereto,
   wherein the first switch is configured to switch the wake-up signal based on the wake-up voltage, and
   wherein the wake-up voltage is a drive voltage to drive the first switch, and the wake-up signal wakes up a controller to turn on the BMS.

2. The BMS power supply management apparatus of claim 1, further comprising:
   a second switch configured to switch a current flowing through the first switch.

3. The BMS power supply management apparatus of claim 1, further comprising:
   a first resistor connected the optoelectronic element and a battery.

4. The BMS power supply management apparatus of claim 1, wherein:
   the controller is further configured to control the first switch based on the wake-up signal.

5. The BMS power supply management apparatus of claim 4, wherein the controller is configured to supply power to the BMS by shorting the first switch based on the wake-up signal.

6. The BMS power supply management apparatus of claim 4, further comprising:
   a first control switch configured to control the first switch, in response to a control of the controller.

7. The BMS power supply management apparatus of claim 2, further comprising:
   a second control switch configured to control the second switch, in response to a control of the controller.

8. The BMS power supply management apparatus of claim 4, wherein the optoelectronic element is configured to output an optical signal to another BMS adjacent to the BMS, in response to another control of the controller.

9. The BMS power supply management apparatus of claim 1, wherein the optoelectronic element comprises an infrared light emitting diode (IR LED).

10. A battery management system (BMS) power supply management method, comprising:
    generating a current in response to an optical signal;
    converting the current into a wake-up voltage; and
    first switching a wake-up signal to be provided to a BMS, in response to the wake-up voltage,
    wherein the first switching comprises applying the wake-up voltage to a second resistor connected to a conversion element configured to convert the current into the wake-up voltage and a battery, wherein the first switching of the wake-up signal comprises first switching the wake-up signal based on the wake-up voltage applied to the second resistor, and
    wherein the wake-up voltage is a drive voltage to drive the first switching, and the wake-up signal wakes up a controller to turn on the BMS.

11. The BMS power supply management method of claim 10, further comprising:
    second switching the first switched wake-up signal.

12. The BMS power supply management method of claim 10, wherein the converting comprises converting the current into the wake-up voltage through a first resistor connected to an optoelectronic element configured to generate the current and a battery.

13. The BMS power supply management method of claim 10, further comprising:
    controlling a first switch to provide power to the BMS based on the wake-up signal.

14. The BMS power supply management method of claim 13, wherein the controlling comprises supplying the power to the BMS by shorting the first switch based on the wake-up signal.

15. The BMS power supply management method of claim 13, wherein the controlling comprises:
    generating a first control signal to control the first switch; and
    controlling the first switch based on the first control signal.

16. The BMS power supply management method of claim 11, wherein the second switching comprises:
    generating a second control signal to control a second switch to perform the second switching; and
    controlling the second switch based on the second control signal.

17. The BMS power supply management method of claim 10, further comprising:
    outputting an optical signal to another BMS adjacent to the BMS.

18. The BMS power supply management method of claim 10, wherein the generating comprises generating the current from an infrared ray received through an infrared light emitting diode (IR LED).

* * * * *